(12) United States Patent
Luo et al.

(10) Patent No.: US 10,644,716 B1
(45) Date of Patent: May 5, 2020

(54) MULTI-PATH DUAL-SWITCH DIGITAL-TO-ANALOG CONVERTER

(71) Applicant: Analog Devices International Unlimited Company, Limerick (IE)

(72) Inventors: Hao Luo, Hangzhou (CN); Gil Engel, Lexington, MA (US); Steven Rose, Woburn, MA (US); Yuhu Chen, Beijing (CN); Jialin Zhao, Beijing (CN)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/550,582

(22) Filed: Aug. 26, 2019

(51) Int. Cl.
  *H03M 1/74* (2006.01)
  *H03K 19/20* (2006.01)
  *H03L 7/089* (2006.01)
(52) U.S. Cl.
  CPC ............ *H03M 1/745* (2013.01); *H03K 19/20* (2013.01); *H03L 7/0891* (2013.01)
(58) Field of Classification Search
  USPC ......................................................... 341/144
  See application file for complete search history.

(56) References Cited

U.S. PATENT DOCUMENTS

| 8,462,034 | B2 | 6/2013 | Santos et al. |
| 8,604,958 | B2 | 12/2013 | Pfann et al. |
| 8,803,720 | B2 | 8/2014 | Dufrene et al. |
| 8,970,418 | B1 | 3/2015 | Schafferer et al. |
| 9,142,169 | B2 * | 9/2015 | Cheng ................. G09G 3/36 |
| 9,413,394 | B1 | 8/2016 | Lye et al. |
| 9,577,657 | B1 | 2/2017 | Clara |
| 9,584,151 | B1 | 2/2017 | Manganaro et al. |
| 9,666,156 | B2 * | 5/2017 | Tu ...................... G09G 3/3688 |
| 10,148,277 | B1 | 12/2018 | Singh et al. |
| 10,270,462 | B2 * | 4/2019 | Aoki .................... G09G 3/20 |

FOREIGN PATENT DOCUMENTS

EP    2019487    5/2013

OTHER PUBLICATIONS

Erdmann et al., *A 330mW 14b 6.8GS/s Dual-Mode RF DAC in 16nm FinFET Achieving—70.8dBc ACPR in a 20MHz Channel at 5.2GHz*, ISCC 2017, Session 16, Gigahertz Data Converters, 16.3, 3 pages.

(Continued)

*Primary Examiner* — Brian K Young
(74) *Attorney, Agent, or Firm* — Patent Capital Group

(57) ABSTRACT

A multi-path dual-switch DAC refers to implementing multiple paths in a switch driver and only two switches in a DAC stack of a DAC unit. In addition to multiple paths configured to improve the driving ability of the input signals, the switch driver of a multi-path dual-switch DAC unit includes two or more logic gates configured to act as multiplexers combining some of the output signals from different paths. The use of such logic gates enables using only two switches in the DAC stack unit to receive the data. Furthermore, optionally, additional logic gates may be used to combine some other output signals from different paths to generate dummy signals, thus providing internal dummy logic. The multi-path dual-switch DACs described herein may advantageously use half-clock rate and reduce or eliminate supply modulation issues, while also reducing power consumption and improving linearity compared to traditional DAC architectures.

20 Claims, 10 Drawing Sheets

(56) References Cited

OTHER PUBLICATIONS

Schafferer et al., *A 3V CMOS 400mW 14b 1.4GS/s DAC for Multi-Carrier Applications*, ISSCC 2004, Session 20, Digital-to-Analog Converters, 20.1, 10 pages.
Engel et al., *A 16-bit 10Gsps Current Steering RF DAC in 65nm CMOS achieving 65dBc ACLR Multi-Carrier Performance at 4.5GHz Fout*, 2015 Symposium on VLSI Circuits Digest of Technical Papers, 2 pages.
Van de Vel et al., *A 240mW 16b 3.2GS/s DAC in 65nm CMOS with <-80dBc IM3 up to 600 MHz*, ISSCC 2014, Session 11, Data Converters Techniques, 11.7, 3 pages.
Spiridon et al., *A Linearity Improvement Technique for Overcoming Signal-Dependent Induced Switching Time Mismatch in DAC-Based Transmitters*, 978-1-4673-7472-9/15 © 2015 IEEE, 4 pages.
*16-Bit, 400 MSPS Digital-to-Analog Converter*, AD9726, © 2005-2010 Analog Devices, Inc. 24 pages.
*DAC 124S085 12-Bit Micro Power Quad Digital-to-Analog Converter with Rail-to-Rail Output*, Texas Instruments, SNAS348G—May 2006—Revised Apr. 2016, 34 pages.
Vaz et al., *A 13b 4GS/s Digitally Assisted Dynamic 3-Stage Asynchronous Pipelined-SAR ADC*, ISSCC 2017, Session 16, Gigahertz Data Converters, 16.1, 6 pages.
Kester, *Basic DAC Architectures III: Segmented DACs*, MT-016 Tutorial, © 2009 Analog Devices, Inc., 6 pages.
Kester, *Basic DAC Architectures I: String DACs and Thermometer (Fully Decoded) DACs*, MT-014 Tutorial, © 2009 Analog Devices, Inc., 6 pages.

\* cited by examiner

MULTI-PATH DUAL-SWITCH DIGITAL-TO-ANALOG CONVERTER

CROSS-REFERENCE TO RELATED APPLICATIONS

This application claims the benefit of and priority from PCT Application No. PCT/CN2019/095798 filed 12 Jul. 2019, entitled "MULTI-PATH DUAL-SWITCH DIGITAL-TO-ANALOG CONVERTER", incorporated herein by reference in its entirety.

TECHNICAL FIELD OF THE DISCLOSURE

The present disclosure relates generally to electronic devices and, more particularly, to digital-to-analog converter (DAC) systems.

BACKGROUND

Real-world analog signals such as temperature, pressure, sound, or images are routinely converted to a digital representation that can be easily processed in modern digital systems. In many systems, this digital information must be converted back to an analog form to perform some real-world function. The circuits that perform this step are DACs, and their outputs are used to drive a variety of devices. Radio frequency (RF) transmitters, loudspeakers, video displays, motors, mechanical servos, and temperature controls are just a few diverse examples. DACs are often incorporated into digital systems in which real-world signals are digitized by analog-to-digital converters (ADCs), processed, and then converted back to analog form by DACs. In these systems, the performance required of the DACs will be influenced by the capabilities and requirements of the other components in the system. Present day DACs are becoming increasing sophisticated as the range of applications for digital circuits increases.

Many architectures exists for DACs, including delta-sigma DACs, R-2R DACs, string DACs, and current steering DACs. These architectures have varying advantages and disadvantages. For high-speed or high converter/sample rate applications, current steering DACs tend to be the best among the different architectures. Current steering DACs have been moving to higher and higher sample rates as companies push to achieve high instantaneous bandwidth. The requirement of instantaneous bandwidth comes with the additional requirement that dynamic performance should not be sacrificed relative to existing lower bandwidth, lower frequency solutions. For instance, it is desirable to reduce distortions in high speed current steering DACs, but reducing distortions is not trivial.

BRIEF DESCRIPTION OF THE DRAWINGS

To provide a more complete understanding of the present disclosure and features and advantages thereof, reference is made to the following description, taken in conjunction with the accompanying FIGS., wherein like reference numerals represent like parts, in which.

DESCRIPTION OF EXAMPLE EMBODIMENTS OF THE DISCLOSURE

Overview

Figure 1:
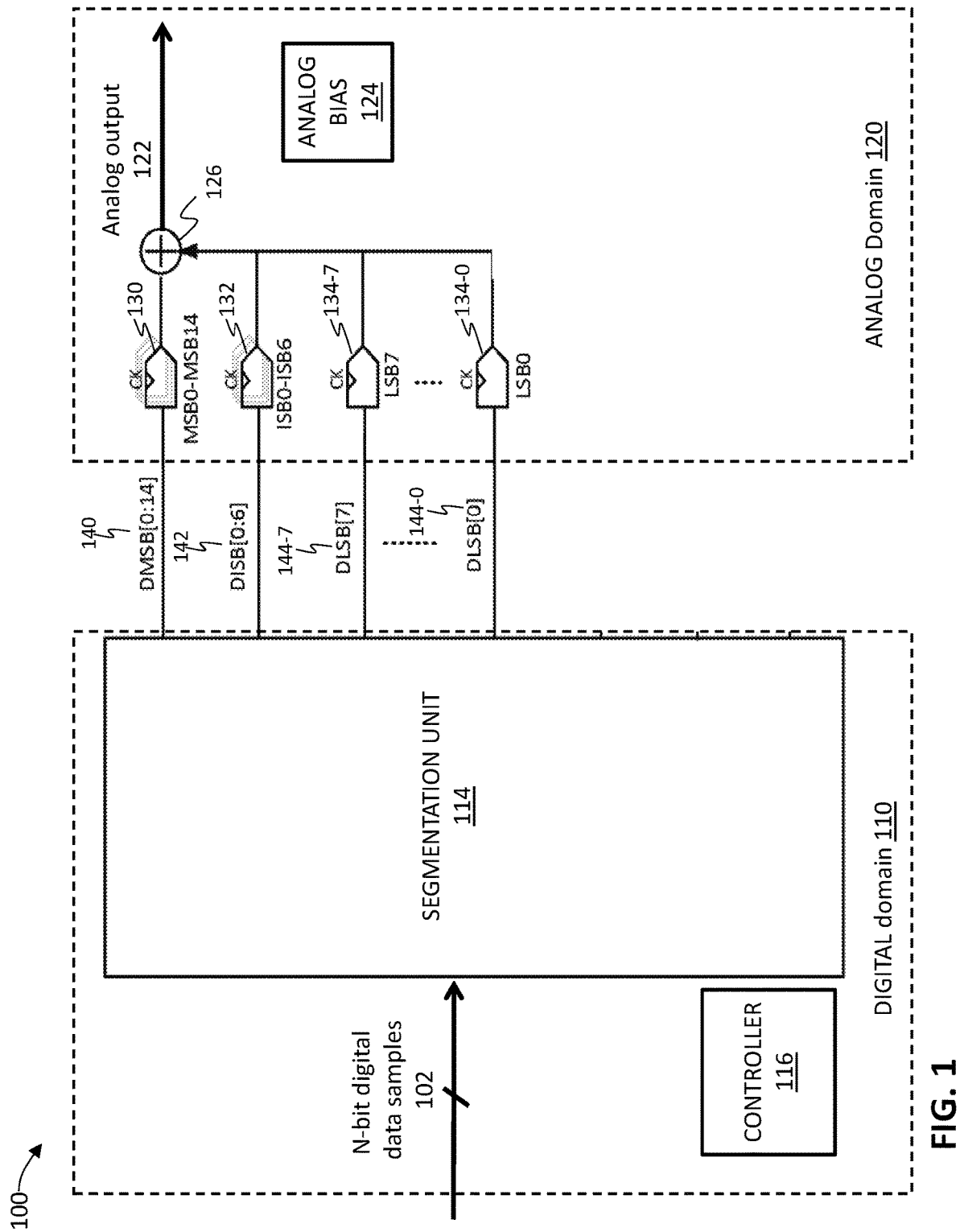
FIG. 1 provides a schematic illustration of an example segmented DAC system, according to some embodiments of the disclosure.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

For purposes of illustrating methods and systems related to multi-path dual-switch DACs, proposed herein, it might be useful to first understand phenomena that may come into play in digital-to-analog conversion. The following foundational information may be viewed as a basis from which the present disclosure may be properly explained. Such information is offered for purposes of explanation only and, accordingly, should not be construed in any way to limit the broad scope of the present disclosure and its potential applications.

A DAC is a device that produces a quantized (discrete step) analog output in response to a digital input signal (also sometimes referred to as "code" or an "input code"). The digital input signal may be e.g. input from transistor logic, emitter-coupled logic, complementary metal-oxide-semiconductor circuits, low-voltage differential signaling, a high-speed interface such as e.g. JESD204, while the analog output signal may be either a voltage or a current. Current steering DACs typically operate by converting a digital input signal, e.g., an X-bit digital input signal, into a current which is an analog representation of the digital input signal. One exemplary way of providing the current output representative of the digital input signal is by providing and distributing bits or parts of the digital signal as driving codes to an array of properly sized current steering DAC units. Each one of the current steering DAC units may provide an appropriately weighted current based on a respective driving code to the unit, where the driving code may be a binary signal (e.g., a logic signal) that controls that the DAC unit operates in either a first state (e.g., when the binary signal is at a first level) or a second state (e.g., when the binary signal is at a second level, different from the first level). As used herein, the term "DAC unit," sometimes also referred to as a "DAC cell," refers to an analog element such as a current source or a switched capacitor element that delivers an analog quantity such as charge or current. For example, in context of a current-steering DAC, a DAC unit may include a DAC element that includes a current source, e.g. a p-type metal-oxide-semiconductor (P-MOS) or an n-type metal-oxide-semiconductor (N-MOS) current source, as well as a switch arrangement associated with the current source.

In a binary weighted DAC, one unit can be provided per bit of the digital input signal to the DAC, where each unit provides a binary weighted current output based on a respective bit of the digital input signal to the DAC. In some other architectures, unary weighted DAC units (receiving thermometer codes) are used instead of binary weighted DAC units. Regardless of the weight of the units, current steering DAC units are each typically implemented with a current source for generating an appropriate amount of current, and a switch arrangement that includes a plurality of switches for steering the current to the DAC output based on a corresponding part of the digital input signal. A switch driver configured to receive a driving code indicative of the digital input signal to be converted to analog and to generate appropriate drive signals for each of the plurality of switches of a DAC unit may also be considered to be a part of the DAC unit. Design of the switch driver, the switch arrangement, and the current source has a large impact on DAC linearity and power consumption.

Traditionally, two paths (i.e., dual-path) in a switch driver of a DAC unit have been used to transfer the effective data, and two switches (i.e., dual-switch) in a switch arrangement of a DAC stack of the DAC unit have been used to receive the data and switch the current from the DAC unit current source to the DAC unit output according to the data. DACs implementing two paths in the switch driver and two switches in the DAC stack of DAC units may be referred to as "dual-path dual-switch" DACs.

Operation of a dual-path dual-switch DAC may be negatively affected by creation of data dependent supply noise where different DAC input data patterns will provide different data dependent interference to DAC's analog output through many different schemes. Such data-dependent interference is treated as noise with respect to the desired analog output signal. In one example of a data dependent interference scheme, different digital data patterns inject different noise into power or ground of a DAC. This noise is then added to final DAC analog output through related DAC units. In another example of a data dependent interference scheme, different digital data patterns affect the quality of the clock signals used to sample or latch related data for synchronization proposes. This noise is also added to the final DAC analog output through related DAC units.

Methods for addressing data dependent supply noise problems as described above exist in prior art. One such method involves generating an additional digital signal to complement, or balance, a digital data signal to be converted by a given DAC unit in that, at each clock cycle, there will be a data toggle either in the digital data signal or in the additional digital signal, where the term "toggle" may refer to the change in the digital input values from 0 to 1 or from 1 to 0 (or, equivalently, the change in the digital input value from some first level to some second level, different from the first level, or the other way around). Providing both of such signals to a combination of a DAC unit and an additional DAC unit referred to as a "dummy DAC" results in the combination converting a uniform pattern comprising alternating 1's and 0's. The output of the dummy DAC unit resulting from the conversion of the bits of the additional digital signal is not used in any way, resulting in a name "dummy signal" being given to such an additional digital signal. Such an approach is described, e.g., in U.S. Pat. No. 6,344,816 (referred to in the following as the "'816 patent") that describes adding an additional clocked circuit called a "dummy latch" in parallel with the main DAC circuit called an "output latch." The output of the dummy latch is not itself used in any way, rather the dummy latch and the output latch are connected and operated such that with every cycle of the clocking signal, one of the latches will change state and the other will not. Thus, if the output latch changes state with the data signal, the dummy latch maintains its logic state, and if the output latch maintains its logic state constant with an unchanging data signal, then the dummy latch will change logic states. According to the '816 patent, this arrangement can maintain a constant loading on the clocking signal that is independent of the data signal logic state, thereby reducing or eliminating data dependent supply noise in DAC's output.

While the approach described above may provide improvements in terms of reducing data dependent supply noise, implementing such an approach is associated with relatively high power consumption. One cause of such high power consumption is the switch driver clock rate being equal to data rate, which is relatively high compared to other structures, and high clock rate means high power consumption and strict timing requirements. Another cause of such high power consumption is the dummy data path consuming about half power of the switch driver. As a result, the approach described above may not be suitable for certain applications where limiting power consumption is critical. One prominent example of such applications are battery-operated devices, e.g., mobile applications where DACs may be used in RF components and products such as cell phones.

Switch drivers with four paths (i.e., quad-path) and four switches (i.e., quad-switch) in a DAC stack (i.e., "quad-path quad-switch" DACs) may address some of the issues described above. Compared to a dual-path dual-switch DAC unit with 2 dummy DACs, the clock rate and the effective data rate of a quad-path quad-switch DAC may be reduced by half at each path of the switch driver, and the four switches may be configured to behave as a data multiplexer so that it is still possible to obtain the full data rate at the DAC unit output. As a result, the clock rate may be cut by half, saving power at the clock path. Also, quad-path quad-switch architecture eliminates the need for including dummy DACs due to RTZ pattern of the input data of the switch drivers used in such architecture. However, due to device mismatch, the four paths in the switch driver may have different timing skew and duty cycle errors, and the four DAC switches may also have four different threshold voltages resulting in duty cycle error at DAC output. It may be very difficult, and sometimes impossible, to calibrate all these dynamic errors because the timing skew error and the duty cycle error may interact with each other in a quad-switch DAC. In addition, compared to the dual-switch structure, the quad-switch structure may result in a relatively larger capacitance at the common source node and switch drain node, which may degrade the linearity of the DAC, especially if used in RF applications.

Present disclosure relates to systems and methods implementing multiple paths (e.g., four) in a switch driver and only two switches in a DAC stack of a DAC unit of a DAC. Therefore, such a DAC may be referred to as a "multi-path dual-switch" DAC. The switch driver in a multi-path dual-switch DAC unit includes two or more logic gates configured to act as multiplexers combining some of the output signals from different paths of the switch driver to generate drive signals to drive the two switches of the DAC stack of the DAC unit and, possibly, to also generate dummy drive signals to drive the dummy switches of the DAC unit. The use of such logic gates enables using only two switches in a DAC stack unit to receive the data. Furthermore, optionally, additional logic gates may be used to combine some other output signals from different paths to generate dummy signals, thus providing internal dummy logic. Similar to the quad-path quad-switch architecture described above, the multi-path dual-switch DACs described herein may advantageously use half-clock rate and reduce or eliminate supply modulation issues. However, due to the reduction in the number of switches in the DAC stacks, power consumption and the capacitance at the DAC common source node and switch drain node can be largely reduced, and linearity of the DAC may be improved, compared to traditional DAC architectures.

The drive signals generated by the switch drivers of the multi-path dual-switch DAC units as described herein may include sequences of binary digital bits (i.e., sequences of 1s and 0s) provided as digital input values to various DAC units. However, it should be noted that descriptions provided herein that refer to the digital input values of 1s and/or 0s for various DAC units (e.g., descriptions that refer to the digital input values to a given DAC unit switching from 0 to 1 or from 1 to 0 in conversion of consecutive digital samples) are applicable to more general embodiments where the DAC units receive one of two different control signals, or receive a binary or logic control signal that has two distinguishable values, that configure the DAC units to operate in one of two states, all of which embodiments being within the scope of the present disclosure. Thus, in general, a DAC unit described to receive, convert, or transfer (which three terms may be used interchangeably) a digital value of 1 may refer to a DAC unit that receives a first control signal, or the control signal has a first value, that configures the DAC unit to operate in a first state of the two states, to generate a first output. On the other hand, in general, a DAC unit described to receive, convert, or transfer a digital value of 0 may refer to a DAC unit that receives a second control signal, different from the first control signal, or the control signal has a second value, different from the first value, that configures the DAC unit to operate in a second state of the two states, the second state being different from the first state, to generate a second output. The first output of such a DAC unit (i.e., the output produced when the DAC unit operates in the first state) is different from the second output of the DAC unit (i.e., the output produced when the DAC unit operates in the second state). In some embodiments, one control signal of the first control signal and the second control signal may be provided in a form of a bit of 1 (or a high logic state) and another control signal of the first control signal and the second control signal may be provided in a form of a bit of 0 (or a low logic state). In some embodiments, a DAC unit operating in the first state may include conducting current to the output of the DAC unit if the DAC unit is a single-ended DAC unit, or may include conducting current to the positive output of the DAC unit if the DAC unit is a differential DAC unit. In some embodiments, a DAC unit operating in the second state may include not conducting current to the output of the DAC unit if the DAC unit is a single-ended DAC unit, or may include conducting current to the negative output of the DAC unit if the DAC unit is a differential DAC unit.

As will be appreciated by one skilled in the art, aspects of the present disclosure, in particular aspects of using a multi-path dual-switch structure to implement a current steering DAC unit, as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "arrangement," "module," or "system." As least some of the functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing DACs, various electronic components or devices that include DACs, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. The terms "substantially," "approximately," "about," etc., may be used to generally refer to being within +/−20% of a target value based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A, B, and/or C).

Segmented DACs

Segmented architectures, where the full resolution of a converter is spread across two or more sub-DACs, can be used for both current- and voltage-output DACs. FIG. 1 illustrates an example segmented DAC system 100 according to some embodiments of the disclosure. The DAC system 100 may receive a digital input signal 102 that includes a sequence of N-bit (where N is greater than 1) digital data samples (typically N-bit binary values) and convert the received digital input into an analog output 122. For example, the analog output 122 may be a current or voltage output where decimal values may be used to represent the sequence of the N-bit digital values of the digital input signal 102. The forward slash sign ("/") shown over the data path 102 in FIG. 1 is used to indicate, as is typically used in the art, that data may be provided in parallel (e.g., such a data path may be a signal bus as opposed to a single signal). For example, for the data path of the digital input 102, this sign indicates that data representing different N-bit digital data samples or that data representing different portions of a given N-bit digital data sample may be provided in parallel, with portions of the complete data provided over the different paths.

In some embodiments, the DAC system 100 may be viewed as comprising a digital domain 110 and an analog domain 120. As shown in FIG. 1, in some embodiments, a segmentation unit (which may also be referred to as a "decoder") 114 configured to implement various coding functions (e.g., thermal coding, binary coding, and weighted coding) and controller 116 configured to control various aspects of the present disclosure may be, and usually are, implemented in the digital domain 110. On the other hand, in some embodiments, an analog bias circuit 124, an output combiner 126, and various DAC units 130, 132, and 134 may be implemented in the analog domain 120.

The segmentation unit 114 may be configured to separate each of the N-bit digital samples/values of the digital input signal 102 into their M-bit most significant bit (MSB) digital sample portion/values, I-bit intermediate significant bit (ISB) digital sample portion/values, and L-bit least significant bit (LSB) digital sample portion/values. Each of the M, I, and L may be an integer equal to or greater than zero and equal to or less than N, so that M+I+L=N. Digital signals 140, 142, and 144 may then be provided from the segmentation unit 114 to the respective DAC units 130, 132, and 134, where the digital signals 140, 142, and 144 indicate which DAC units are to be switched on (e.g., to transfer a value of 1) or off (e.g., to transfer a value of 0) for a conversion of a given digital data sample. The digital signals 140, 142, and 144 are indicative of the MSB digital sample values, the ISB digital sample values, and the LSB digital sample values, respectively, in that they configure the respective DAC units to transfer a value of 1 or 0, depending on which digital sample values are being converted. The MSB signals 140 are provided to the MSB DAC units 140, the ISB signals 142 are provided to the ISB DAC units 132, and the LSB signals 144 are provided to the LSB DAC units 144.

In some embodiments of the DAC system 100, each of the MSB and the ISB may be thermal-coded, while the LSB may be binary-coded, although, in other embodiments, coding may be different. In general, any of the MSB signal 140, the ISB signal 142, and the LSB signal 144 may be coded in any suitable manner, e.g., using any type of weighted and/or thermal coding.

In the example implementation where a certain K-bit digital sample (which may, e.g., be a portion of one of the digital samples of the digital input 102, e.g., the ISB portion) is thermal-coded, the segmentation unit 114 (e.g., a thermal coding element of the segmentation unit 114) may encode a K-bit digital sample into a ($2^K$–1)-bit thermal code which, in turn, may switch the corresponding individual $2^K$–1 thermal DAC units on and off to convert the K-bit digital value to an analog value. For example, if the MSB is thermal-coded, the segmentation unit 114 may encode an M-bit MSB value into a ($2^M$–1)-bit thermal code which is provided, in the MSB signal 140, to the MSB DAC units 130 ($2^M$–1 of the MSB DAC units 130) to switch the individual MSB DAC units 130 on and off to convert the M-bit MSB value or a portion of the digital value of the digital input signal 102 to an analog value. Example shown in FIG. 1 is for a 4-bit MSB (i.e., M=4), in which case the MSB signal 140 may include indications for each of 15 (15=$2^4$–1) MSB DAC units 130 (the 15 MSB DAC units 130 labeled in FIG. 1 as DAC units MSB0 through MSB14) as to whether each DAC unit it to transfer a value of 1 or a 0 for the conversion of this M-bit MSB value. For example, the MSB signal 140 may include $2^M$–1 individual signals to respective individual MSB DAC units 130, with a one-to-one correspondence between one of the $2^M$–1 individual signals of the code signal 140 and a respective one of the $2^M$–1 MSB DAC units 130. In another example, if the ISB is thermal-coded, the segmentation unit 114 may encode an I-bit ISB value into a ($2^I$–1)-bit thermal code which is provided, in the ISB signal 142, to the ISB DAC units 132 ($2^I$–1 of the ISB DAC units 132) to switch the individual ISB DAC units 132 on and off to convert the I-bit ISB value or a portion of the digital value of the digital input signal 102 to an analog value. Example shown in FIG. 1 is for a 3-bit ISB (i.e., I=3), in which case the ISB signal 142 may include indications for each of 7 (7=$2^3$–1) ISB DAC units 132 (the 7 ISB DAC units 132 labeled in FIG. 1 as DAC units ISB0 through ISB6) as to whether each unit it to transfer a value of 1 or a 0 for the conversion of this I-bit ISB value. For example, the ISB signal 142 may include $2^I$–1 individual signals to respective individual ISB DAC units 132, with a one-to-one correspondence between one of the $2_I$–1 individual signals of the code signal 142 and a respective one of the $2_I$–1 ISB DAC units 132.

In the example implementation where a certain digital sample (which may, e.g., be a portion of one of the digital samples of the digital input 102, e.g., the LSB portion) is binary-coded, the segmentation unit 114 (e.g., a binary coding element of the segmentation unit 114) may encode the K-bit digital sample into a K-bit binary code which, in turn, may switch the corresponding individual K binary DAC units on and off to convert the K-bit digital value to an analog value. For example, if the LSB is binary-coded, the segmentation unit 114 may encode an L-bit LSB value into an L-bit binary code which is provided, in the LSB signal 144, to the LSB DAC units 134 (L of the LSB DAC units 134) to switch the individual LSB DAC units 134 on and off to convert the L-bit LSB value or a portion of the digital value of the digital input signal 102 to an analog value. Example shown in FIG. 1 is for an 8-bit LSB (i.e., L=8), in which case the LSB signal 144 may include indications for each of 8 LSB binary DAC units 134 (the 8 LSB DAC units 134 labeled in FIG. 1 as DAC units LSB0 through LSB7) as to whether each unit it to transfer a value of 1 or a 0 for the conversion of this L-bit LSB value. For example, the LSB signal 144 may include L individual signals to respective individual LSB DAC units 134, with a one-to-one correspondence between one of the L individual signals of the code signal 144 and a respective one of the L LSB DAC units 134. This is shown in FIG. 1 by showing the individual portions of the code signal 144 as a portion 144-0 ($1^{st}$ portion) provided to the LSB DAC unit 134-0, and so on, until a portion 144-7 ($8^{th}$ portion) provided to the LSB DAC unit 134-7.

In general, various ones of the DAC units 130, 132, and 134 may be scaled/weighted as desired. Therefore, in general, descriptions provided with reference to FIG. 1 are applicable to other types of coding used for different portions of the digital input signal 102, and for different numbers of bits for each of the different portions of the digital input signal 102.

The DAC units 130, 132, and 134 may generate analog voltage or current according to the reference voltage or current provided by the analog bias block 124. The analog combiner 126 may then add the outputs from all the DAC units 130, 132, and 134 to generate the final analog output 122, which can be analog voltage or analog current.

Segmented DAC architectures such as the one shown in FIG. 1 may help achieving a balance between accuracy and design complexity of a converter. One benefit of segmentation is that it allows reducing the number of DAC units required to achieve a given resolution (e.g., N bits), thus allowing smaller die sizes. Therefore, it is common for high-resolution DACs to be segmented. Multi-path dual-switch DAC architecture described herein may be used in, but are not limited to being used in, segmented DACs. For example, each DAC unit of at least some of, or all of the DAC units 130, 132, and 134 shown in FIG. 1 may be implemented as a multi-path dual-switch DAC unit as described herein.

The controller 116 may be configured to generate control signals which control an operation mode of the DAC system 100 (e.g., control power on and off, sample rate, output range, filter bandwidth, etc.), a range of the analog output signal 122, and so on. In particular, the controller 116 may be configured to control multi-path dual-switch DAC unit(s) described herein. Although shown in FIG. 1 as being separate from the segmentation unit 114, in some embodiments the controller 116 may be included within the segmentation unit 114.

Figure 2B:
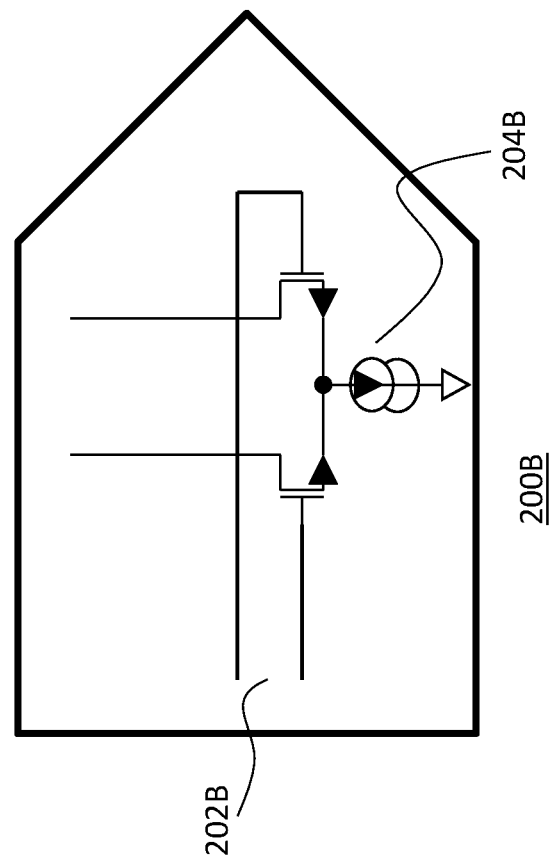
FIGS. 2A and 2B provide schematic illustrations of current steering DAC units using, respectively, P-MOS and N-MOS switches.
Figure 2A:
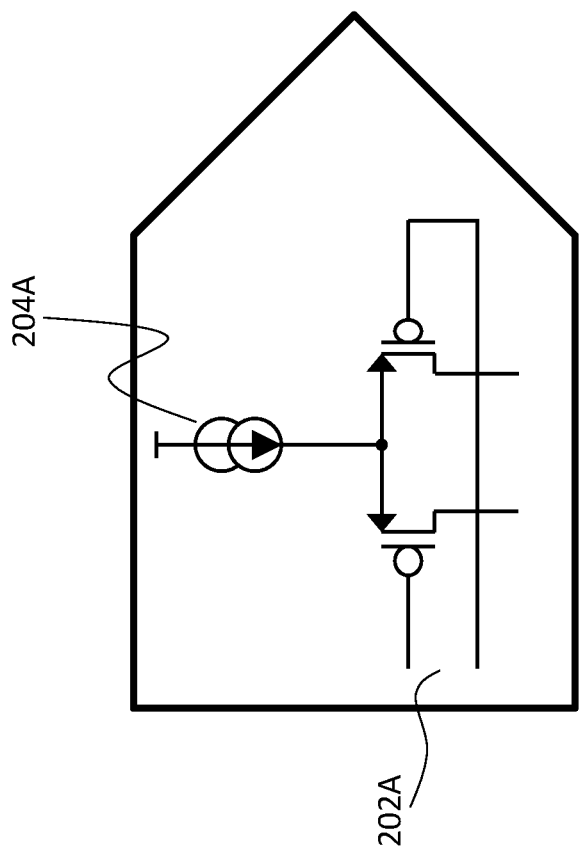

There are many different methods to convert digital input values to analog voltage or current values, switch current being one of the most popular methods for high-speed high-resolution DACs. FIGS. 2A and 2B provide schematic illustrations for DAC stacks 200A and 200B using, respectively, P-MOS and N-MOS switches, as known in the art. A given DAC unit of a DAC system, e.g., any one of the DAC units 130, 132, 134 shown in FIG. 1, may include a DAC stack implemented either as the DAC stack 200A or the DAC stack 200B. The DAC stacks 200A and 200B as shown to receive, respectively, digital input signals 202A and 202B. The digital input signals can be differential digital codes (as shown in the examples of FIGS. 2A and 2B) or single-ended digital codes, depending on the design specification. The DAC stacks 200A or 200B are configured to control the output of their respective current sources 204A or 204B to provide output current in a DAC system such as the DAC system 100. It is the currents from the current sources such as 204A or 204B that are added together by the combiner 126 to generate DAC's final analog current output 122 (similar functionality may be implemented for the voltage output).

Dual-Switch DAC Stack

Figure 3:
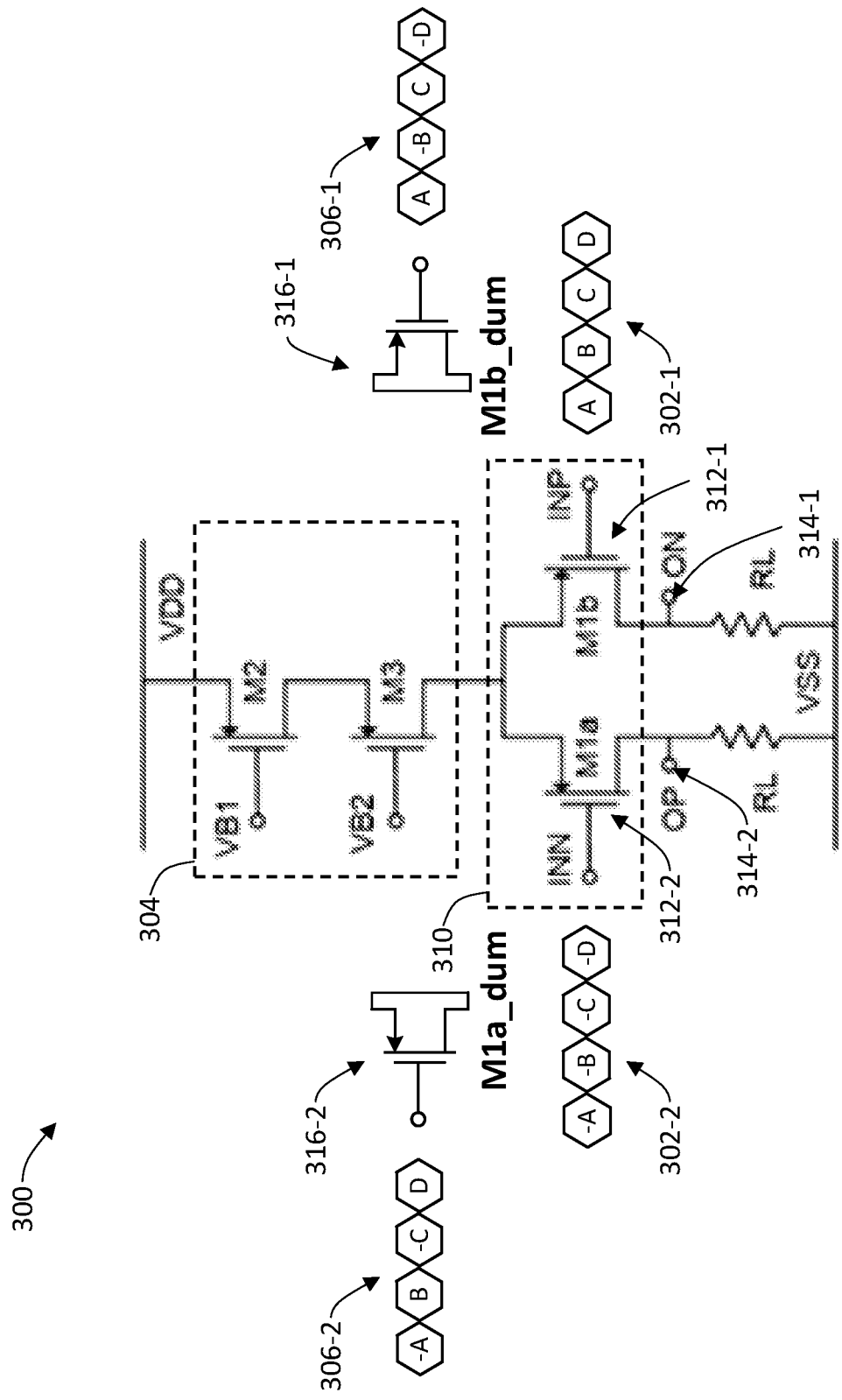
FIG. 3 provides a schematic illustration of a DAC stack with a dual-switch arrangement for a multi-path dual-switch DAC unit, according to some embodiments of the disclosure.

FIG. 3 provides a schematic illustration of a DAC stack 300 with a dual-switch arrangement for a multi-path dual-switch DAC unit, according to some embodiments of the disclosure. The DAC stack 300 may be considered to be one part of a current steering DAC unit. A switch driver 400 shown in FIG. 4 may be considered to be another part of such a DAC unit. Because of the presence of multiple paths in the switch driver 400, such a DAC unit may be referred to as a "multi-path DAC unit." Because of the presence of only two switches that are configured to steer current generated by the current source of the DAC stack 300 to be used for digital-to-analog conversion, such a DAC unit may be referred to as a "dual-switch DAC unit." Thus, a current steering DAC unit that includes the DAC stack 300 and the switch driver 400 may be referred to as a multi-path dual-switch DAC unit. Such a current steering DAC unit may be any of the DAC units 130, 132, 134, described with reference to FIG. 1.

As shown in FIG. 3, the DAC stack 300 includes a current source 304 and a switch arrangement 310 that includes two switches 312-1 and 312-2 (i.e., the switch arrangement 310 is a dual-switch arrangement 310). The current source 304 is shown in FIG. 3 to have two transistors, labeled as M2 and M3, where one source or drain (S/D) terminal of transistor M2 is coupled to one S/D terminal of transistor M3. However, in general, the current source 304 may include any circuit configured to generate current that may be provided to the switch arrangement 310.

The switches 312 of the switch arrangement 310 are shown in FIG. 3 as transistors, in particular, as field-effect transistors (FETs), e.g., as PMOS transistors. However, in general, descriptions provided herein with reference to the switches/transistors 312 are applicable to any other types of switches, e.g., transistors other than FETs, or switches other than transistors.

The transistors 312 of the switch arrangement 310 are configured to steer the current of the current source 304 to a first output 314-1 or a second output 314-2 of the DAC stack 300 depending on the driving code provided to the current steering DAC unit. In particular, the driving code may be provided to the current steering DAC unit by providing a first drive signal 302-1 to the first transistor 312-1 of the DAC stack 300 (e.g., to a gate of the first transistor 312-1, that input labeled in FIG. 3 as INP), and by providing a second drive signal 302-2 to the second transistor 312-2 of the DAC stack 300 (e.g., to a gate of the second transistor 312-2, that input labeled in FIG. 3 as INN). The first drive signal 302-1 is schematically illustrated in FIG. 3 as a signal that includes a sequence A, B, C, D, where in this case, and in following examples of sequences with letters, each letter represents a different bit of a binary signal (in this case, of the binary signal that is the first drive signal 302-1). In one example, such different bits may be two different voltages. In other examples, such different bits may be a logic "high" or logic "low," or logic levels corresponding to two different analog levels. The second drive signal 302-2 is schematically illustrated in FIG. 3 as a signal that includes a sequence −A, −B, −C, −D, where the "−" sign represents an inverted version of the bits A, B, C, D of the first drive signal 302-1. Thus, the first and second drive signals 302-1, 302-2 are complementary signals, forming a differential input signal 302.

Optionally, the multi-path dual-switch DAC unit may also include a pair of dummy DAC switches, shown as a first dummy switch 316-1 and a second dummy switch 316-2. The dummy switches 316 are shown in FIG. 3 as transistors, in particular, as FETs, e.g., as PMOS transistors. However, in general, descriptions provided herein with reference to the dummy switches/transistors 316 are applicable to any other types of switches, e.g., transistors other than FETs, or switches other than transistors. The first and second dummy switches 316-1, 316-2 are configured to be driven with a first dummy drive signal 306-1 and a second dummy drive signal 306-2, respectively. Similar to the first and second drive signals 302-1, 302-2, the first and second dummy drive signals 306-1, 306-2 are complementary signals. In some embodiments, the first dummy drive signal 306-1 may be substantially the same as the first drive signal 302-1 except that, in the first dummy drive signal 306-1, every even bit of the first drive signal 302-1 is replaced with its inverted version, as is indicated in FIG. 3 with the first dummy drive signal 306-1 including a sequence A, –B, C, –D. In some embodiments, the second dummy drive signal 306-2 may be substantially the same as the second drive signal 302-2 except that, in the second dummy drive signal 306-2, every odd bit of the second drive signal 302-2 is replaced with its inverted version, as is indicated in FIG. 3 with the second dummy drive signal 306-2 including a sequence –A, B, –C, D. Provision of such dummy drive signals 306-1, 306-1 to the dummy drive switches 316-1, 316-2, may enable addressing data dependent supply noise issues as known in the art, e.g., as described above. However, the generation of the dummy drive signals 306-1, 306-2 is different compared to how such signals are generated in the art. Namely, the switch driver 400 may be configured to generate the dummy drive signals 306-1, 306-2 in addition to the first and second drive signals 302-1, 302-2.

In various embodiments, the switches 312-1, 312-2 to which the drive signals 302-1 and 302-2 are provided may be swapped, compared to what is shown in FIG. 3. Similarly, the dummy switches 316-1, 316-2 to which the dummy drive signals 306-1 and 306-2 are provided may also be swapped, compared to what is shown in FIG. 3.

As described above, a multi-path dual-switch DAC unit that includes the DAC stack 300 and the switch driver 400 may be any of the DAC units 130, 132, 134, described with reference to FIG. 1, where the first and second drive signals 302-1 and 302-2 are related to the digital input signal 102 as explained with the following example. To convert a given N-bit digital sample of the digital input signal 102, the segmentation unit 114 may first break up the sample to an M-bit MSB portion, an I-bit long ISB portion, and an L-bit long LSB portion, where N=M+I+L, as described above. For example, the digital input signal 102 may be a sequence of N-bit digital samples and a given N-bit digital sample may be a 15-bit digital sample (i.e., N=15), e.g., a binary 15-bit digital sample 100110111000011. For an example where M=4, I=3, and L=8 (which is the example illustrated in our FIG. 1), the M-bit MSB portion of such an N-bit digital sample would be 1001 (i.e., a 4-bit value), the I-bit ISB portion of such an N-bit digital sample would be 101 (i.e., a 3-bit value), and the L-bit LSB portion of such an N-bit digital sample would be 11000011. Once the segmentation unit 114 broke up the N-bit sample into its MSB, ISB, and LSB portions, it establishes which ones of the DAC units should be operating in a first state and which ones of the DAC units should be operating in a second state to convert these portions. Signals 140, 142, and 144, shown in FIG. 1, are control signals that the segmentation unit 114 sends to different ones of the DAC units 130, 132, and 134 to indicate to each DAC unit whether the DAC unit should be operating in a first state or in a second state (e.g., whether it should be on or off) as this N-bit sample is being converted. Thus one of the signals 140 provided to one of the MSB DAC units is an indication that this MSB DAC unit should be operating in a first state (e.g., by providing the signal 140 as a first voltage provided to the DAC unit) or an indication that this MSB DAC unit should be operating in a second state (e.g., by providing the signal 140 as a second voltage, different from the first voltage, provided to the DAC unit), and so on for other DAC units. When a sequence of N-bit digital samples is being converted, each of the signals 140, 142, 144 may, correspondingly, be a sequence of values, each value corresponding to a different N-bit digital sample and indicating whether a given DAC unit should be in a first state or in a second state during the conversion of that N-bit digital sample. The sequence A, B, C, D shown in FIG. 3, and subsequent figures, and referred to as a "driving code", is an example of one of the signals 140, 142, 144 for one DAC unit (so each one of the signals 140, 142, 144 is a driving code for a different DAC unit). For example, consider that the sequence A, B, C, D is a portion of the signal 144-7 to the DAC unit 134-7 (one of the LSB DAC units). In this example, value A of the signal 144-7 indicates whether the DAC unit 134-7 should be operating in a first state or in a second state for the conversion of a first N-bit digital sample, value B of the signal 144-7 indicates whether the DAC unit 134-7 should be operating in a first state or in a second state for the conversion of a second N-bit digital sample, value C of the signal 144-7 indicates whether the DAC unit 134-7 should be operating in a first state or in a second state for the conversion of a third N-bit digital sample, value D of the signal 144-7 indicates whether the DAC unit 134-7 should be operating in a first state or in a second state for the conversion of a fourth N-bit digital sample, and so on. Thus, each of the control signals 140, 142, 144 is a binary or logic signal that has two distinguishable levels, which levels control whether the DAC unit to which a given control signal is provided operates in one of two distinguishable states (e.g., the first state or the second state, described above). In general, each of the control signals 140, 142, 144 may be represented as a sequence A, B, C, D, and so on (e.g., a sequence of single-bit values) provided to a given DAC unit as the first drive signal 302-1, described herein. The second drive signal 302-2 and the dummy drive signals 306-1 and 306-2 are certain variations of the bits of the first drive signal 302-1. The bit values A, B, C, and D of the drive signals 302 and the bit values of the dummy signals 306 are set/generated based on the sequence of the N-bit digital values of the digital input signal 102.

Multi-Path Switch Driver with Logic Gates

Figure 4:
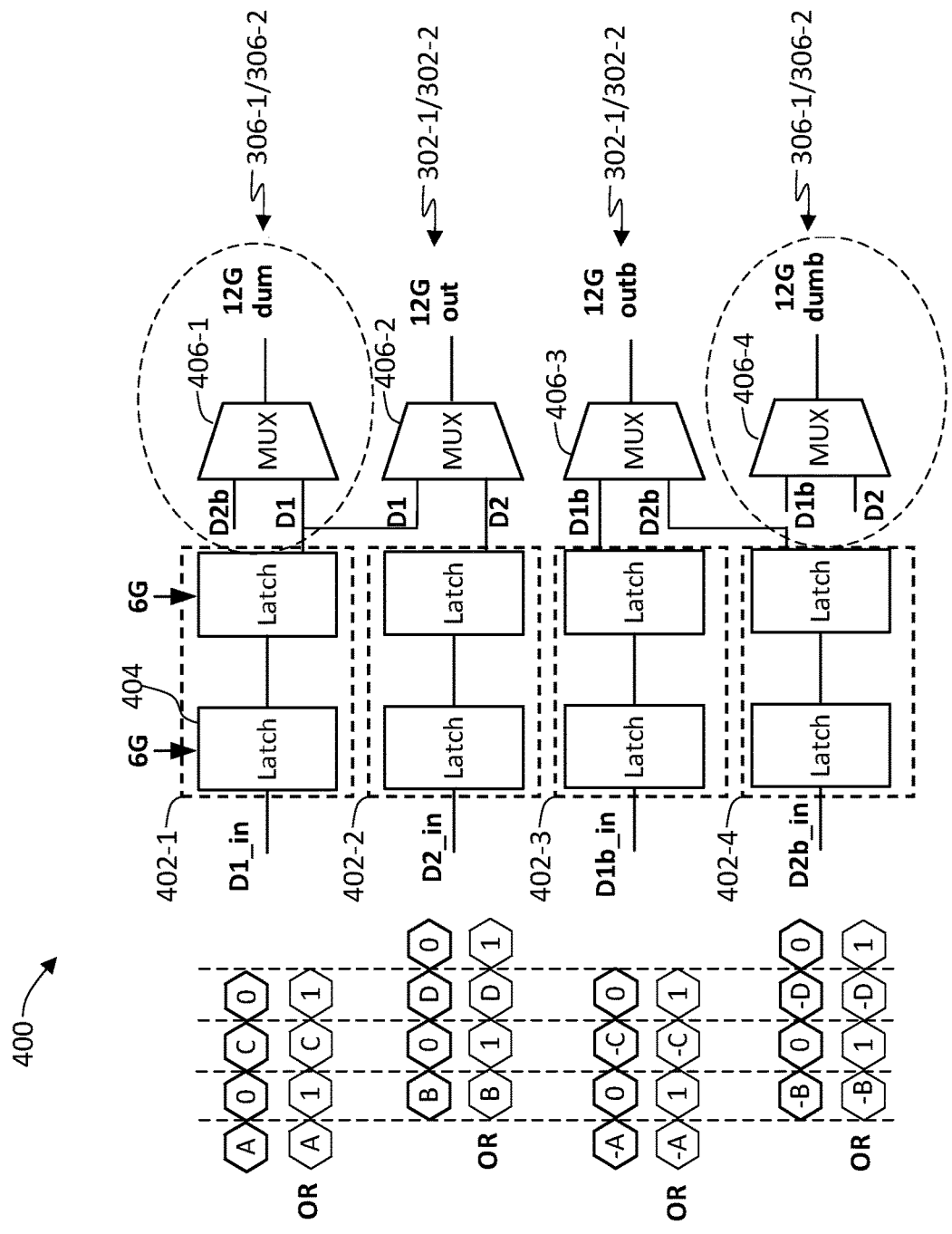
FIG. 4 provides a schematic illustration of a multi-path switch driver for a multi-path dual-switch DAC unit, according to some embodiments of the disclosure.

FIG. 4 provides a schematic illustration of a multi-path switch driver 400 for a multi-path dual-switch DAC unit, according to some embodiments of the disclosure. As shown in FIG. 4, in some embodiments, the switch driver 400 may include four paths, labeled as a first path 402-1, a second path 402-2, a third path 402-3, and a fourth path 402-4. However, in other embodiments, more paths may be included, e.g., 8 paths.

Each of the paths 402 is configured to receive an input signal that is processed by one or more latches 404, and it provided at the output of the path as an output signal. In order to not clutter the drawing, only one latch is labeled in FIG. 4 with the reference numeral 404, while a plurality of such latches are illustrated. In addition, while FIG. 4 illustrates 2 latches 404 in each of the paths 402, in other embodiments, any other number of one or more latches 404 may be used in different paths 402, and, in some embodiments, different ones of the paths 402 may include different numbers of latches 404.

As is known in the art, a switch driver is configured to perform one or more of the following: enhance the driving ability of the input signals, make the output signal bits aligned from one path to another path inside a single DAC unit, and make the output signal bits aligned from one DAC unit to another DAC unit in a single DAC system. For each of the paths 402, the sequence of bits provided as an input signal to the path is the same as that of an output signal of the path. The following nomenclature is used for the input and output signal of the paths 402 shown in FIG. 4, as well as in the subsequent drawings illustrating the paths 402: the first path 402-1 is configured to receive a first input signal D1_in and to generate a first output signal D1, the second path 402-2 is configured to receive a second input signal D2_in and to generate a second output signal D2, the third path 402-3 is configured to receive a third input signal D1*b*_in (where the letter "b" stands for "bar" to indicate that the third input signal D1*b*_in is a signal complementary to the first input signal D1_in) and to generate a third output signal D1*b*, and the fourth path 402-4 is configured to receive a fourth input signal D2*b*_in (which is a signal complementary to the second input signal D2_in) and to generate a fourth output signal D2*b*.

The input signals provided to the different paths 402 are half-clock rate signals in either RTZ or RTO arrangement, where a combination of the first input signal D1_in and the second input signal D2_in provides a full-clock rate signal (this is illustrated in FIG. 4 with each of the latches 404 receiving a 6 Gigabit (G) clock signal, shown only for the two latches 404 of the first path 402-1 and not for the other paths 402 in order to not clutter the drawing, while the output signals from the multiplexers 406 are shown as 12 G signals; of course, in other embodiments, the clock rates may be of different values). For example, if a full-clock rate signal is a signal A, B, C, D, then the first input signal D1_in may include odd bits of the full-clock rate signal in a RTZ arrangement (illustrated on the left side of FIG. 4 as the first input signal A, 0, C, 0) while the second input signal D2_in may include even bits of the full-clock rate signal in a RTZ arrangement (illustrated on the left side of FIG. 4 as the second input signal B, 0, D, 0). In another example, for the full-clock rate signal A, B, C, D, the first input signal D1_in may include odd bits of the full-clock rate signal in a RTO arrangement (illustrated on the left side of FIG. 4 as the first input signal A, 1, C, 1) while the second input signal D2_in may include even bits of the full-clock rate signal in a RTO arrangement (illustrated on the left side of FIG. 4 as the second input signal B, 1, D, 1). Examples of two different possibilities for each of the third and fourth input signals D1*b*_in and D2*b*_in are also shown in FIG. 4. In particular, since the third input signal D1*b*_in is complementary to the first input signal D1_in, if the first input signal D1_in is a RTZ signal, then the third input signal D1*b*_in may be a signal −A, 0, −C, 0, whereas, if the first input signal D1_in is a RTO signal, then the third input signal D1*b*_in may be a signal −A, 1, −C, 1, as illustrated on the left side of FIG. 4. Similarly, since the fourth input signal D2*b*_in is complementary to the second input signal D2_in, if the second input signal D2_in is a RTZ signal, then the fourth input signal D2*b*_in may be a signal −B, 0, −D, 0, whereas, if the second input signal D2_in is a RTO signal, then the fourth input signal D2*b*_in may be a signal −B, 1, −D, 1, as illustrated on the left side of FIG. 4.

As further shown in FIG. 4, the switch driver 400 further includes a plurality of multiplexers 406, which may, e.g., be implemented as various logic gates, configured to combine multiple output signals from different paths to generate the first and the second drive signals 306-1. In particular, FIG. 4 illustrates four multiplexers shown as a first multiplexer 406-1, a second multiplexer 406-2, a third multiplexer 406-3, and a fourth multiplexer 406-4, but, in some embodiments of the switch driver 400, the first and the fourth multiplexers 406-1 and 406-4, illustrated to be within dashed oval contours, may be excluded (i.e., those multiplexers are optional).

The multiplexers 406 are configured to operate as follows. The second multiplexer 406-2 is configured to combine the first output signal D1 (i.e., the output signal from the first path 402-1) and the second output signal D2 (i.e., the output signal from the second path 402-2) to generate one of the first drive signal 302-1 and the second drive signal 302-2 (i.e., the second multiplexer 406-2 is configured to generate either the first drive signal 302-1 or the second drive signal 302-2). The third multiplexer 406-3 is configured to combine the third output signal D1*b* (i.e., the output signal from the third path 402-3) and the fourth output signal D2*b* (i.e., the output signal from the fourth path 402-4) to generate the other one of the first drive signal 302-1 and the second drive signal 302-2 (i.e., the third multiplexer 406-3 is configured to generate the one of the first drive signal 302-1 and the second drive signal 302-2 that is not generated by the second multiplexer 406-2). Thus, the second and the third multiplexers 406-2, 406-3 are configured to generate both the first drive signal 302-1 and the second drive signal 302-2 to be provided to the first and second switches 312-1, 312-2 of the DAC stack 300. On the other hand, the first and the fourth multiplexers 406-1, 406-4 are configured to generate both the first dummy drive signal 306-1 and the second dummy drive signal 306-2 to be provided to the first and second dummy switches 316-1, 316-2 of the DAC stack 300. In particular, the first multiplexer 406-1 is configured to combine the first output signal D1 (i.e., the output signal from the first path 402-1) and the fourth output signal D2*b* (i.e., the output signal from the fourth path 402-4) to generate one of the first dummy drive signal 306-1 and the second dummy drive signal 306-2 (i.e., the first multiplexer 406-1 is configured to generate either the first dummy drive signal 306-1 or the second dummy drive signal 306-2). On the other hand, the fourth multiplexer 406-4 is configured to combine the third output signal D1*b* (i.e., the output signal from the third path 402-3) and the second output signal D2 (i.e., the output signal from the second path 402-2) to generate the other one of the first dummy drive signal 306-1 and the second dummy drive signal 306-2 (i.e., the fourth multiplexer 406-4 is configured to generate the one of the first dummy drive signal 306-1 and the second dummy drive signal 306-2 that is not generated by the first multiplexer 406-1).

Example Input and Output Data Patterns for a Multi-Path Switch Driver with Different Logic Gates Which one of the second and third multiplexers 406-2, 406-3 generates the first drive signal 302-1 and which one generates the second drive signal 302-2, and which one of the first and fourth multiplexers 406-1, 406-4 generates the first dummy drive signal 306-1 and which one generates the second dummy drive signal 306-2 depends on 1) whether the input signals to the different paths 402 are RTZ signals or RTO signals, and 2) what kind of logic gate is used to implement the multiplexers 406. FIGS. 5-8 illustrate some examples of input and output data patterns (i.e., of input and output signals for different paths 402) where the multiplexers 406 are implemented as different logic gates. Thus, each of the FIGS. 5-8 provides a different example of the switch driver 400 of FIG. 4.

Figure 5:
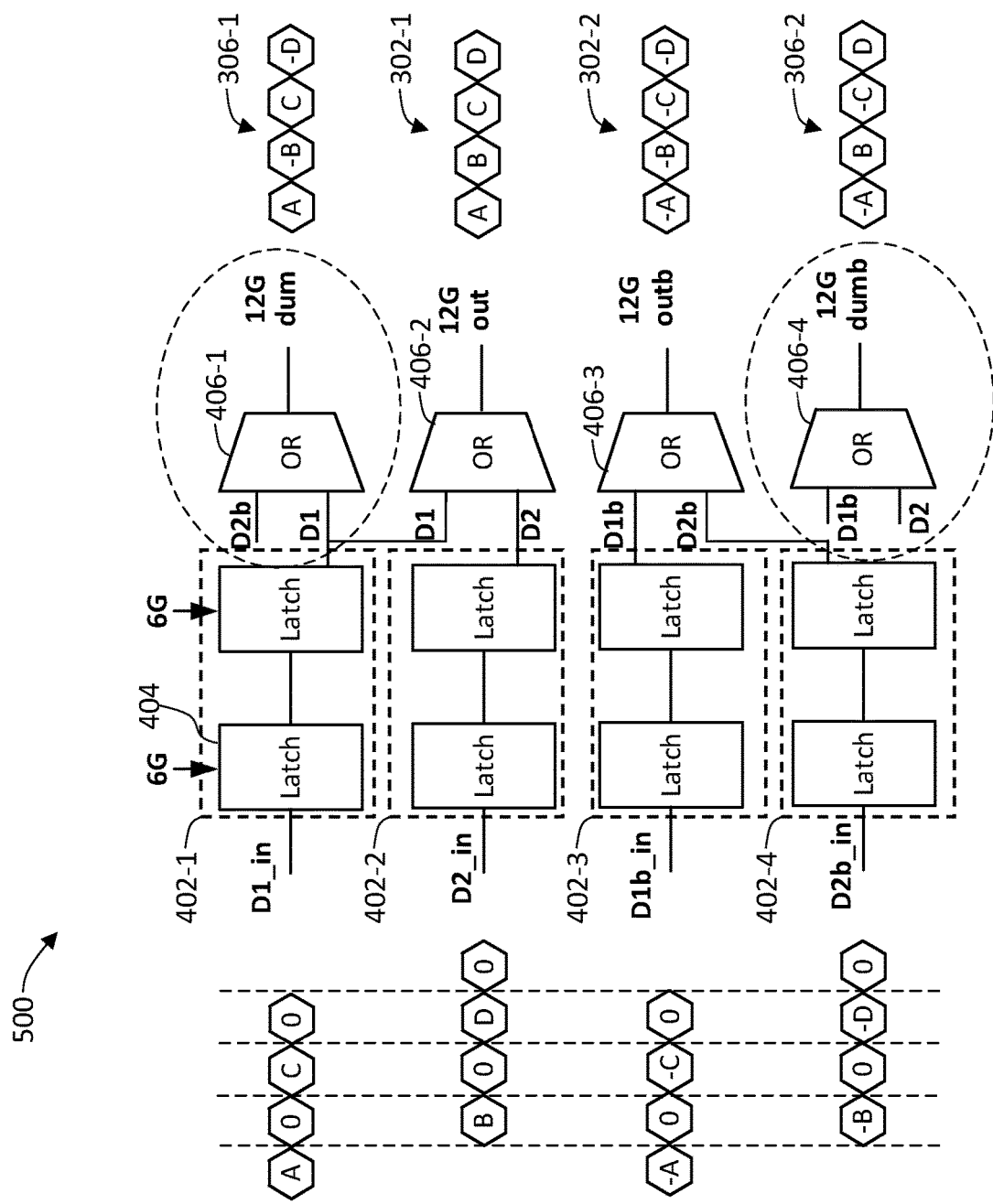
FIG. 5 provides a schematic illustration of example input and output data patterns for a multi-path switch driver of FIG. 4 with return-to-zero (RTZ) input data pattern and OR logic gates, according to some embodiments of the disclosure.

FIG. 5 provides a schematic illustration 500 of example input and output data patterns for a multi-path switch driver of FIG. 4 with RTZ input data pattern and the multiplexers 406 implemented as OR logic gates, according to some embodiments of the disclosure. In the example of FIG. 5, all of the input signals to the different paths 402 are half-clock rate RTZ signals. This means that, if the first input signal D1_in includes a sequence A, 0, C, 0, then the second input signal D2_in includes a sequence B, 0, D, 0 (because, together, the first and second input signals are supposed to form a full-clock rate signal). This also means that, if the first input signal D1_in includes a sequence A, 0, C, 0, then the third input signal D1b_in includes a sequence –A, 0, –C, 0 (because the first and third input signals are supposed to be complementary signals), and the fourth input signal D2b_in includes a sequence –B, 0, –D, 0 (because the second and fourth input signals are supposed to be complementary signals).

With the input signals to different paths 402 as shown in FIG. 5, and with each of the multiplexers 406 being implemented as an OR logic gate, the output signals from the multiplexers 406 will be as follows. The second multiplexer 406-2 is configured to combine the first output signal D1 (i.e., the sequence A, 0, C, 0) and the second output signal D2 (i.e., the sequence B, 0, C, 0) to generate the first drive signal 302-1 (i.e., the sequence A, B, C, D). The third multiplexer 406-3 is configured to combine the third output signal D1b (i.e., the sequence –A, 0, –C, 0) and the fourth output signal D2b (i.e., the sequence –B, 0, –D, 0) to generate the second drive signal 302-2 (i.e., the sequence –A, –B, –C, –D). On the other hand, if included in the switch driver 400, the first multiplexer 406-1 is configured to combine the first output signal D1 (i.e., the sequence A, 0, C, 0) and the fourth output signal D2b (i.e., the sequence –B, 0, –D, 0) to generate the first dummy drive signal 306-1 (i.e., the sequence A, –B, C, –D). On the other hand, if included in the switch driver 400, the fourth multiplexer 406-4 is configured to combine the third output signal D1b (i.e., the sequence –A, 0, –C, 0) and the second output signal D2 (i.e., the sequence B, 0, D, 0) to generate the second dummy drive signal 306-2 (i.e., the sequence –A, B, –C, D).

Figure 6:
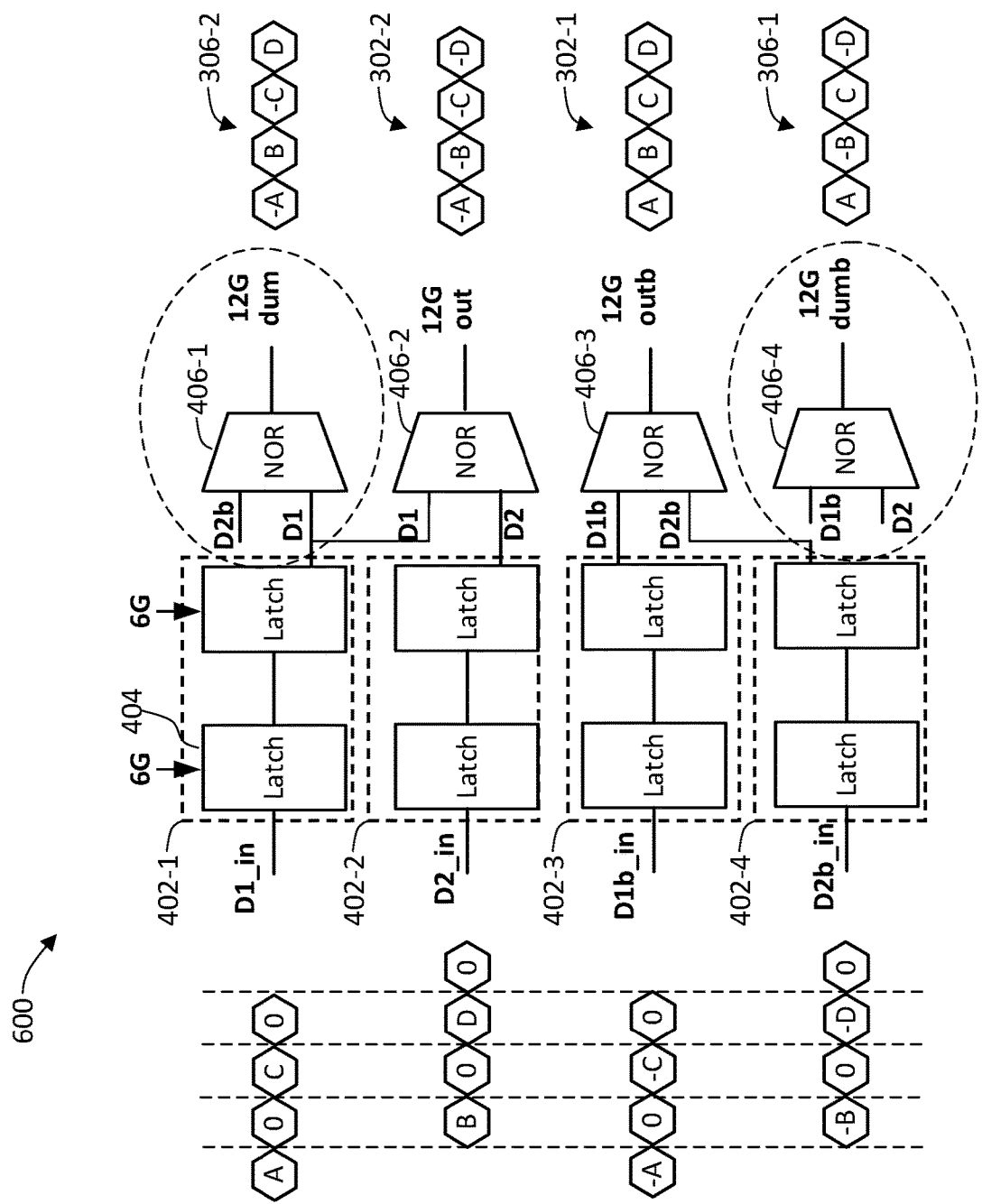
FIG. 6 provides a schematic illustration of example input and output data patterns for a multi-path switch driver of FIG. 4 with RTZ input data pattern and NOR logic gates, according to some embodiments of the disclosure.

FIG. 6 provides a schematic illustration 600 of example input and output data patterns for a multi-path switch driver of FIG. 4 with RTZ input data pattern and the multiplexers 406 implemented as NOR logic gates, according to some embodiments of the disclosure. FIG. 6 illustrates that, for some embodiments of the input signals as shown in FIG. 5, each of the multiplexers 406 may be implemented as a NOR logic gate. This would result in the outputs from the different multiplexers 406 shown in FIG. 6 being inverted versions of the outputs from the different multiplexers 406 shown in FIG. 5. More specifically, with the input signals to different paths 402 as shown in FIG. 6 (i.e., the same input signals as described with reference to FIG. 5), and with each of the multiplexers 406 being implemented as a NOR logic gate, the output signals from the multiplexers 406 will be as follows. The second multiplexer 406-2 is configured to combine the first output signal D1 (i.e., the sequence A, 0, C, 0) and the second output signal D2 (i.e., the sequence B, 0, D, 0) to generate the second drive signal 302-2 (i.e., the sequence –A, –B, –C, –D). The third multiplexer 406-3 is configured to combine the third output signal D1b (i.e., the sequence –A, 0, –C, 0) and the fourth output signal D2b (i.e., the sequence –B, 0, –D, 0) to generate the first drive signal 302-1 (i.e., the sequence A, B, C, D). On the other hand, if included in the switch driver 400, the first multiplexer 406-1 is configured to combine the first output signal D1 (i.e., the sequence A, 0, C, 0) and the fourth output signal D2b (i.e., the sequence –B, 0, –C, 0) to generate the second dummy drive signal 306-2 (i.e., the sequence –A, B, –C, D). On the other hand, if included in the switch driver 400, the fourth multiplexer 406-4 is configured to combine the third output signal D1b (i.e., the sequence –A, 0, –C, 0) and the second output signal D2 (i.e., the sequence B, 0, D, 0) to generate the first dummy drive signal 306-1 (i.e., the sequence A, –B, C, –D).

Figure 7:
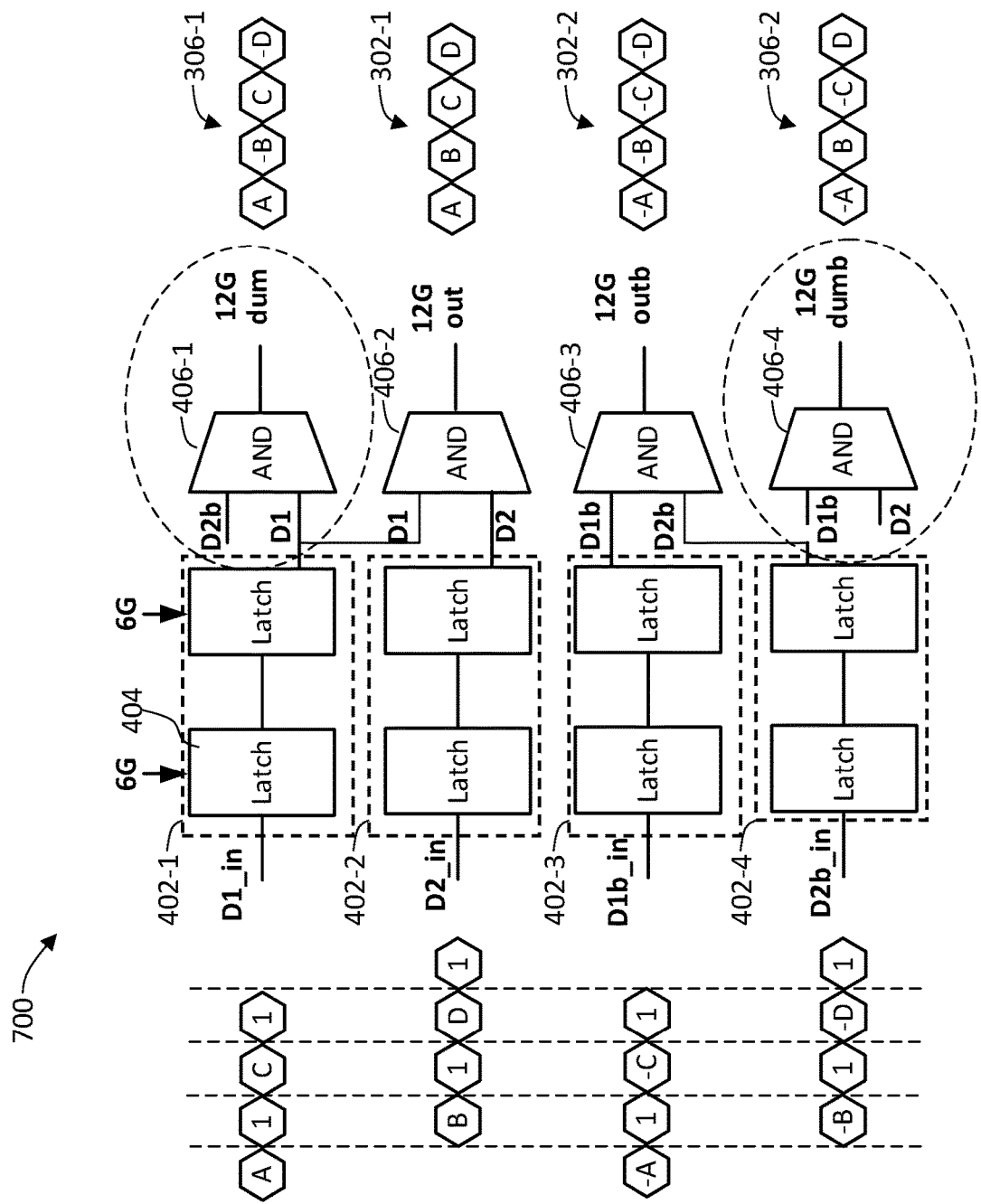
FIG. 7 provides a schematic illustration of example input and output data patterns for a multi-path switch driver of FIG. 4 with return-to-one (RTO) input data pattern and AND logic gates, according to some embodiments of the disclosure.

FIG. 7 provides a schematic illustration 700 of example input and output data patterns for a multi-path switch driver of FIG. 4 with RTO input data pattern and the multiplexers 406 implemented as AND logic gates, according to some embodiments of the disclosure. In the example of FIG. 7, all of the input signals to the different paths 402 are half-clock rate RTO signals. This means that, if the first input signal D1_in includes a sequence A, 1, C, 1, then the second input signal D2_in includes a sequence B, 1, D, 1 (because, together, the first and second input signals are supposed to form a full-clock rate signal). This also means that, if the first input signal D1_in includes a sequence A, 1, C, 1, then the third input signal D1b_in includes a sequence –A, 1, –C, 1 (because the first and third input signals are supposed to be complementary signals), and the fourth input signal D2b_in includes a sequence –B, 1, –D, 1 (because the second and fourth input signals are supposed to be complementary signals).

With the input signals to different paths 402 as shown in FIG. 7, and with each of the multiplexers 406 being implemented as an AND logic gate, the output signals from the multiplexers 406 will be as follows. The second multiplexer 406-2 is configured to combine the first output signal D1 (i.e., the sequence A, 1, C, 1) and the second output signal D2 (i.e., the sequence B, 1, D, 1) to generate the first drive signal 302-1 (i.e., the sequence A, B, C, D). The third multiplexer 406-3 is configured to combine the third output signal D1b (i.e., the sequence –A, 1, –C, 1) and the fourth output signal D2b (i.e., the sequence –B, 1, –D, 1) to generate the second drive signal 302-2 (i.e., the sequence –A, –B, –C, –D). On the other hand, if included in the switch driver 400, the first multiplexer 406-1 is configured to combine the first output signal D1 (i.e., the sequence A, 1, C, 1) and the fourth output signal D2b (i.e., the sequence –B, 1, –D, 1) to generate the first dummy drive signal 306-1 (i.e., the sequence A, –B, C, –D). On the other hand, if included in the switch driver 400, the fourth multiplexer 406-4 is configured to combine the third output signal D1b (i.e., the sequence –A, 1, –C, 1) and the second output signal D2 (i.e., the sequence B, 1, D, 1) to generate the second dummy drive signal 306-2 (i.e., the sequence –A, B, –C, D).

Figure 8:
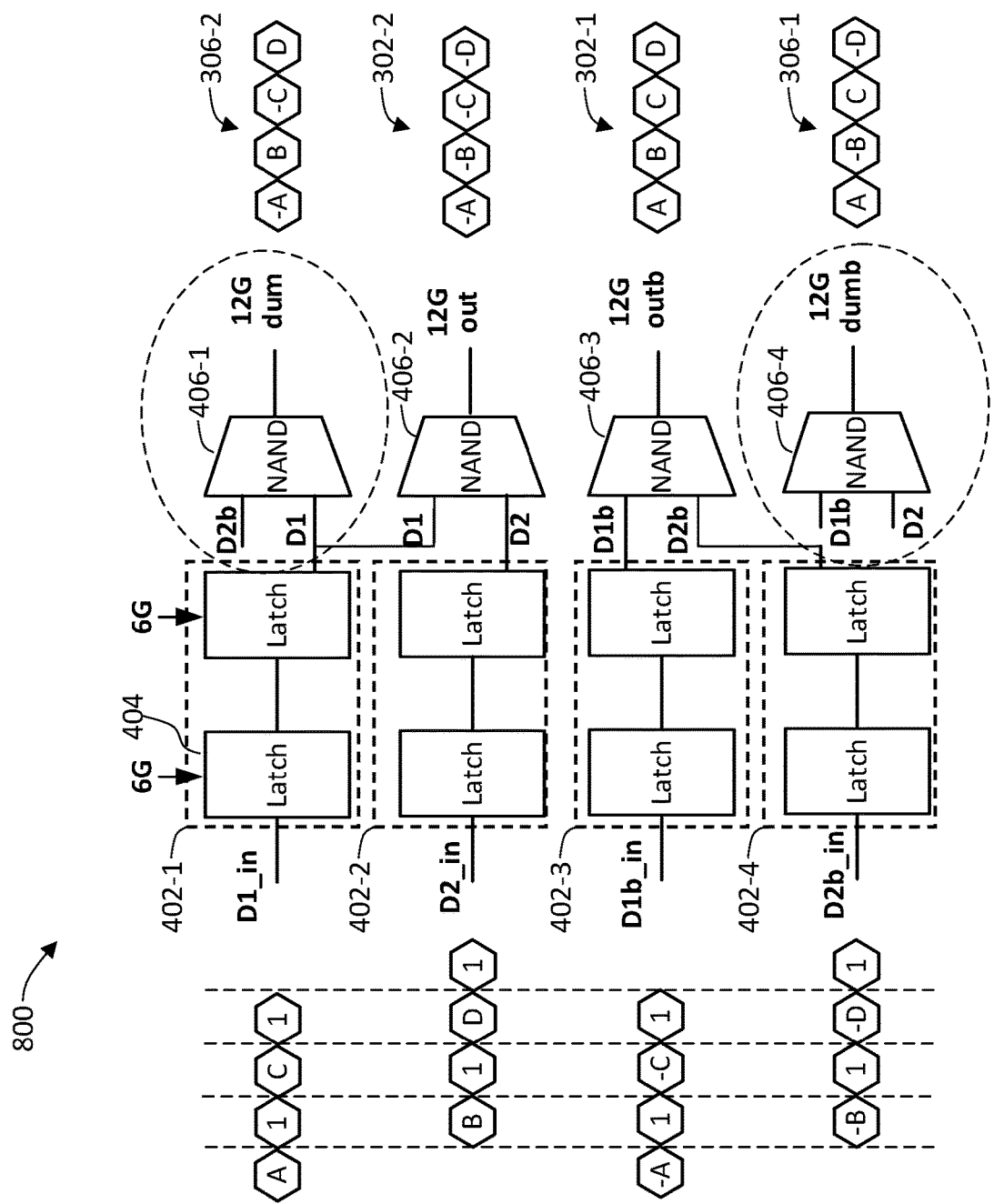
FIG. 8 provides a schematic illustration of example input and output data patterns for a multi-path switch driver of FIG. 4 with RTO input data pattern and NAND logic gates, according to some embodiments of the disclosure.

FIG. 8 provides a schematic illustration 800 of example input and output data patterns for a multi-path switch driver of FIG. 4 with RTO input data pattern and the multiplexers 406 implemented as NAND logic gates, according to some embodiments of the disclosure. FIG. 8 illustrates that, for some embodiments of the input signals as shown in FIG. 7, each of the multiplexers 406 may be implemented as a NAND logic gate. This would result in the outputs from the different multiplexers 406 shown in FIG. 8 being inverted versions of the outputs from the different multiplexers 406 shown in FIG. 7. More specifically, with the input signals to different paths 402 as shown in FIG. 8 (i.e., the same input signals as described with reference to FIG. 7), and with each of the multiplexers 406 being implemented as a NAND logic gate, the output signals from the multiplexers 406 will be as follows. The second multiplexer 406-2 is configured to combine the first output signal D1 (i.e., the sequence A, 1, C, 1) and the second output signal D2 (i.e., the sequence B, 1, D, 1) to generate the second drive signal 302-2 (i.e., the sequence −A, −B, −C, −D). The third multiplexer 406-3 is configured to combine the third output signal D1*b* (i.e., the sequence −A, 1, −C, 1) and the fourth output signal D2*b* (i.e., the sequence −B, 1, −D, 1) to generate the first drive signal 302-1 (i.e., the sequence A, B, C, D). On the other hand, if included in the switch driver 400, the first multiplexer 406-1 is configured to combine the first output signal D1 (i.e., the sequence A, 1, C, 1) and the fourth output signal D2*b* (i.e., the sequence −B, 1, −D, 1) to generate the second dummy drive signal 306-2 (i.e., the sequence −A, B, −C, D). On the other hand, if included in the switch driver 400, the fourth multiplexer 406-4 is configured to combine the third output signal D1*b* (i.e., the sequence −A, 1, −C, 1) and the second output signal D2 (i.e., the sequence B, 1, D, 1) to generate the first dummy drive signal 306-1 (i.e., the sequence A, −B, C, −D).

DDR, SDR, and Mix Mode

Embodiments of the multi-path dual-switch may be used with various modes of data transfer, such as double data rate (DDR), single data rate (SDR), and mix mode. Moreover, these three modes are compatible for a single implementation of a multi-path dual-switch DAC with one of the embodiments of the DAC stack 300 and one of the embodiments of the switch driver 400. This is very much desirable as it enables the customers to choose the most suitable mode according to a given application case. At DDR and mix mode, both clock rising edge and falling edge may be used for data sample. For example, the odd bits of an input driving code may be sampled by clock rising edge, and the even bits of the input driving code may be sampled by clock falling edge, or the other way around. As a result, the clock rate can be cut by half to save power. Moreover, at mix mode, the odd bits of an input driving code may be flipped based on the last even bits of the input driving code. Similarly, at mix mode, the even bits of an input driving code may be flipped based on the last odd bits of the input driving code. As a result, only odd or even bits need to be transferred before the DAC unit, and the flipping function can be implemented in the DAC unit so that the data rate at DAC unit input can be cut by half, saving the power of the circuitries before the DAC unit (for example, data interface circuitry and digital data path may be located before the DAC unit and may consume a large portion of power of the whole chip). On the other hand, for the SDR, only the clock rising edge or the clock falling edge may be used for data sample. For example, clock rising edge may be used to sample the odd bits of an input driving code, and the even bits may be the same as the last odd bits. In this case, the even bits may not need to be sampled so that the clock falling edge is not used. In other examples, clock falling edge may be used for data sample, instead of clock rising edge. In another example, the even bits of an input driving code may be sampled by clock rising or falling edge, and the odd bits may be the same as the last even bits. The illustrations provided in FIGS. 4-8 are provided for the general case of DDR. If in DDR, the full-clock rate input signal may include a sequence A, B, C, D, as described above, then, for SDR, the full-clock rate input signal would be A, A, C, C. Therefore, for SDR, illustrations of and descriptions of FIGS. 4-8 would be modified to replace all instances of a bit B with a bit A, to replace all instances of a bit D with a bit C, to replace all instances of a bit −B with a bit −A, and to replace all instances of a bit −D with a bit −C (which illustrations and descriptions modified in this manner are not provided here in the interests of brevity). Similarly, if in DDR, the full-clock rate input signal may include a sequence A, B, C, D, as described above, then, for mix mode, the full-clock rate input signal would be A, −A, C, −C. Therefore, for mix mode, illustrations of and descriptions of FIGS. 4-8 would be modified to replace all instances of a bit B with a bit −A, to replace all instances of a bit D with a bit −C, to replace all instances of a bit −B with a bit A, and to replace all instances of a bit −D with a bit C (which illustrations and descriptions modified in this manner are not provided here in the interests of brevity).

Operating a Multi-Path Dual-Switch DAC

Figure 9:
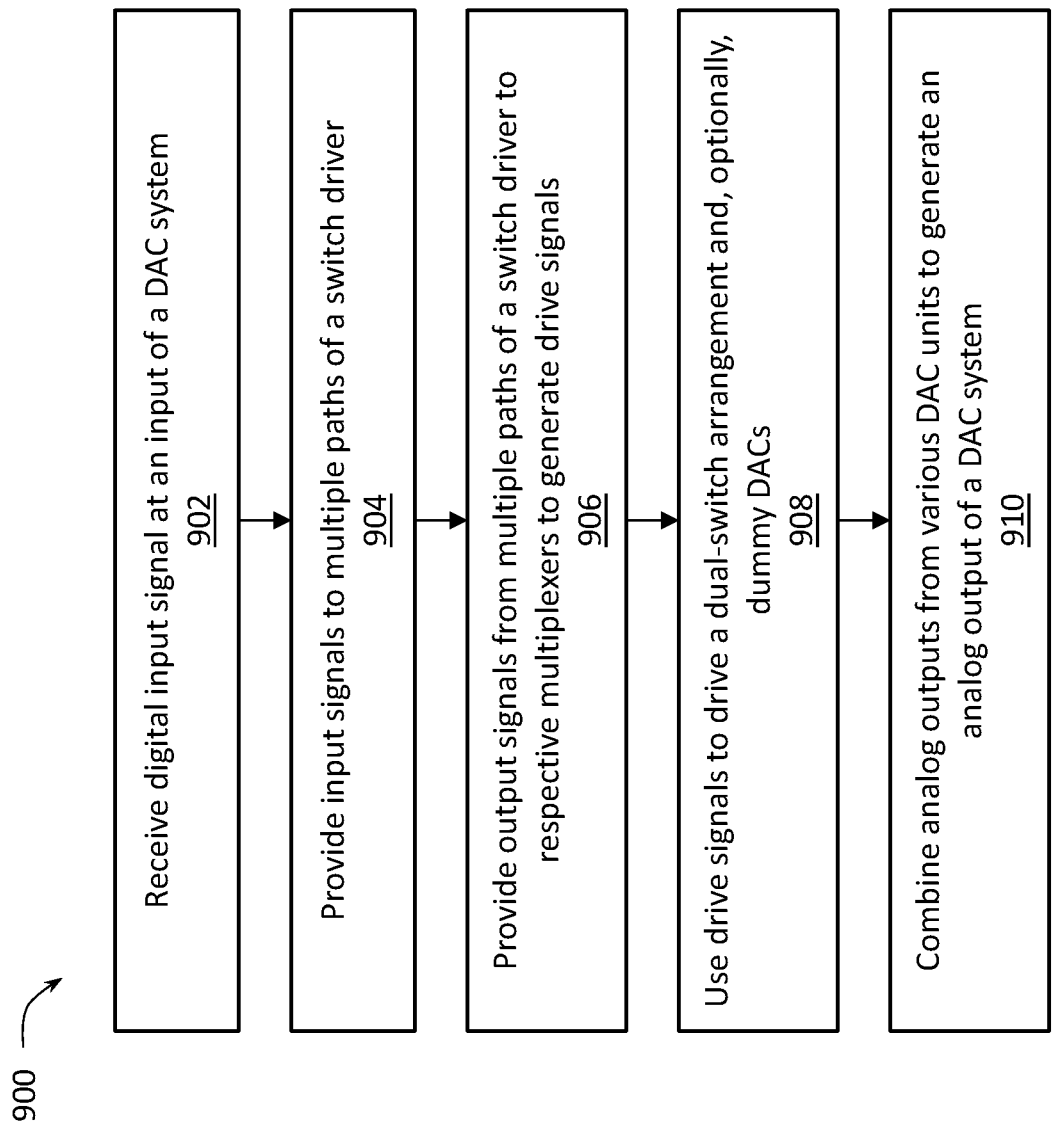
FIG. 9 provides a block diagram illustrating a method for operating a multi-path dual-switch DAC, according to some embodiments of the disclosure.

FIG. 9 provides a block diagram illustrating a method 900 for operating a multi-path dual-switch DAC, according to some embodiments of the disclosure. Although description of the method 900 is provided with reference of the components of the multi-path dual-switch DAC shown in FIGS. 1, 3 and 4, any DAC system, configured to implement the processes of the method 900, in any suitable order, is within the scope of the present disclosure.

The method 900 may begin with 902, where the digital input signal is provided to a DAC system, e.g., the N-bit digital data samples 102 are provided to the DAC system 100.

The digital input signal may be used to generate input signals to be provided, in 904, to each of the multiple paths of a switch driver, e.g., the switch driver 400, for each of the DAC units, e.g., for each of the DAC units 130, 132, 134. For example, in some embodiments, 904 may include providing first, second, third, and fourth input signals to, respectively, first, second, third, and fourth paths to generate, respectively, first, second, third, and fourth output signals. For example, the input signals provided to the multiple paths in 904 may include the input signals D1_in, D2_in, D1*b*_in, and D2*b*_in, as described above, and the output signals generated by the multiple paths in 904 may include the output signals D1, D2, D1*b*, and D2*b*, as described above. As described above, the first, the second, the third, and the fourth output signals are either all RTZ signals or all RTO signals. In some embodiments, the first output signal may include the odd bits of a driving code provided to the DAC unit, the second output signal may include the even bits of the driving code, the third output signal may include the inverted odd bits of the driving code, and the fourth output signal may include the inverted even bits of the driving code.

The input signals provided in 904 may then be processed by the one or more latches of the various respective paths 402 to generate respective output signals, which are then provided, in 906, to respective multiplexers 406 to generate drive signals as described herein. For example, in 906, the first and second drive signals 302-1 and 302-2 may be generated, as described above. For example, in some embodiments, 906 may include providing the first output signal D1 and the second output signal D2, described above, as, respectively, first and second inputs to a first logic gate, e.g., the second multiplexer 406-2, to generate the first drive signal, e.g., the first drive signal 302-1, as an output of the first logic gate. 906 may further include providing the third output signal D1*b* and the fourth output signal D2*b* as, respectively, first and second inputs to a second logic gate, e.g., the third multiplexer 406-3, to generate the second drive signal, e.g., the second drive signal 302-2, as an output of the second logic gate.

In addition, optionally, 906 may also include generating the first and second dummy drive signals 306-1 and 306-2 as well, as also described above. For example, in some embodiments, 906 may include providing the first output signal D1 and the fourth output signal D2b as, respectively, first and second inputs to a third logic gate, e.g., the first multiplexer 406-1, to generate the first dummy drive signal, e.g., the first dummy drive signal 306-1, as an output of the third logic gate. In some embodiments, 906 may further include providing the third output signal D1b and the second output signal D2 as, respectively, first and second inputs to a fourth logic gate, e.g., the fourth multiplexer 406-4, to generate the second dummy drive signal, e.g., the second dummy drive signal 306-2, as an output of the fourth logic gate.

In 908, the drive signals generated in 906 may be used to drive the dual-switch arrangement 310 of respective DAC units. In addition, optionally, 908 may include using the dummy drive signals generated in 906 to drive the dummy switches/transistors 316-1 and 316-2. For example, in some embodiments, 908 may include using the first drive signal 302-1 to drive the first transistor 312-1 to operate in either a first state or a second state and using the first dummy drive signal 306-1 to drive the first dummy transistor 316-1 to operate in either the first state or the second state so that, at each clock cycle, exactly one of the first transistor 312-1 and the first dummy transistor 316-1 switches from operating in the first state to operating in the second state or switches from operating in the second state to operating in the first state. Similarly, in some embodiments, 908 may also include using the second drive signal 302-2 to drive the second transistor 312-2 to operate in either the first state or the second state and using the second dummy drive signal 306-2 to drive the second dummy transistor 316-2 to operate in either the first state or the second state so that, at each clock cycle, exactly one of the second transistor 312-2 and the second dummy transistor 316-2 switches from operating in the first state to operating in the second state or switches from operating in the second state to operating in the first state.

The method 900 may conclude with 910, where analog outputs from the dual-switch arrangements 310 of various DAC units are combined (e.g., using the combiner 96) to generate an analog output (e.g., the analog output 92) of the DAC system.

Example Data Processing System

Figure 10:
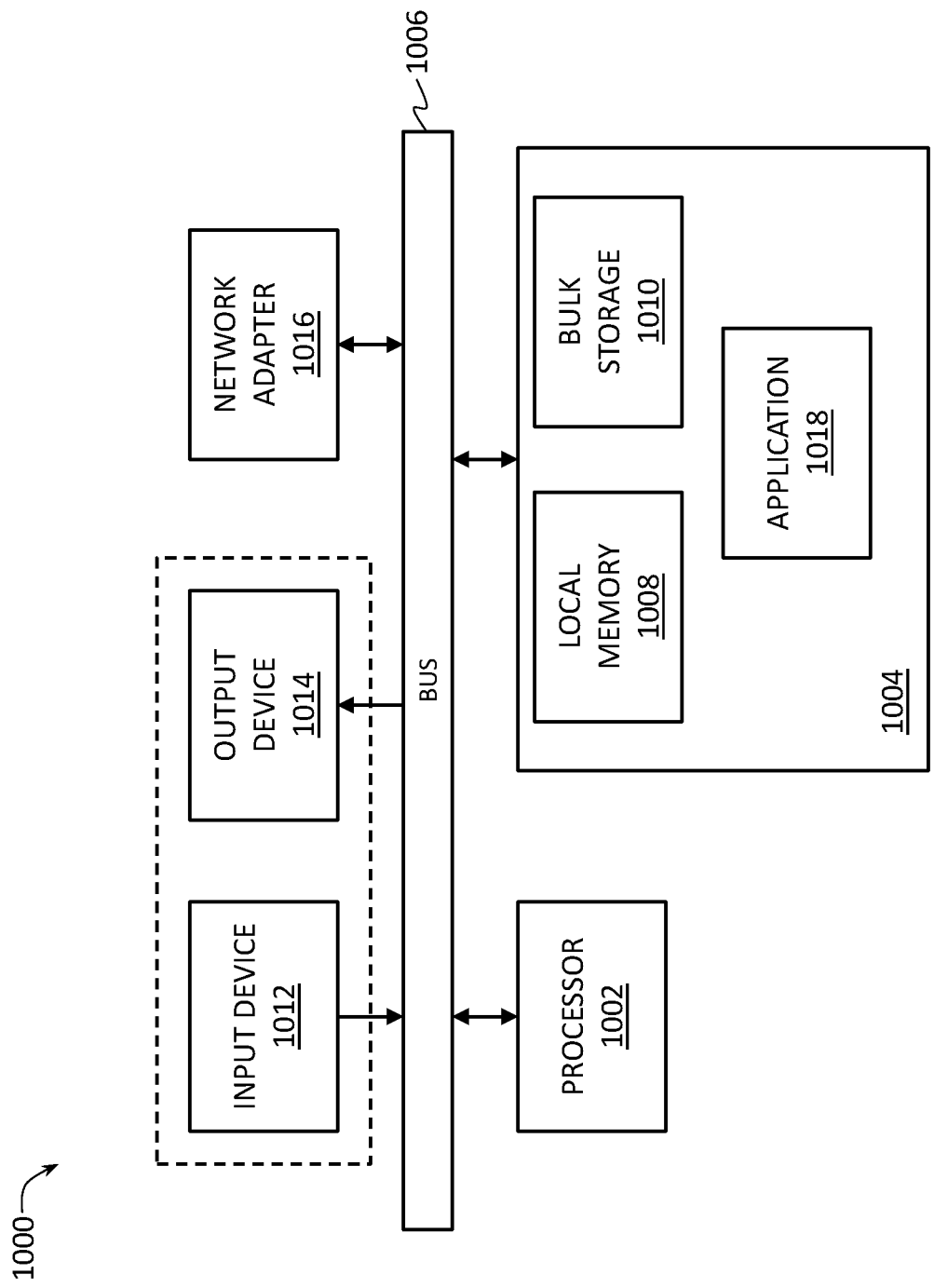
FIG. 10 provides a block diagram illustrating an example data processing system that may be configured to implement, or control, at least portions of performing digital-to-analog conversion using a multi-path dual-switch DAC, according to some embodiments of the present disclosure.

FIG. 10 provides a block diagram illustrating an example data processing system 1000 that may be configured to implement, or control, at least portions of performing digital-to-analog conversion using a multi-path dual-switch DAC, according to some embodiments of the present disclosure.

FIG. 10 provides a block diagram illustrating an example data processing system 1000 that may be configured to implement, or control implementations of, at least portions of performing digital-to-analog conversion using a multi-path dual-switch DAC as described herein, e.g., using the DAC stack 300 as described with reference to FIG. 3 and using the switch driver 400 as described with reference to FIGS. 4-9, according to some embodiments of the present disclosure. For example, in some embodiments, the data processing system 1000 may implement a control logic, e.g., the controller 116 as described with reference to FIG. 1, configured to control at least portions of implementing digital-to-analog conversion using a multi-path dual-switch DAC as described herein, e.g., to control implementation of the method 900 as described with reference to FIG. 9.

As shown in FIG. 10, the data processing system 1000 may include at least one processor 1002, e.g. a hardware processor 1002, coupled to memory elements 1004 through a system bus 1006. As such, the data processing system may store program code within memory elements 1004. Further, the processor 1002 may execute the program code accessed from the memory elements 1004 via a system bus 1006. In one aspect, the data processing system may be implemented as a computer that is suitable for storing and/or executing program code. It should be appreciated, however, that the data processing system 1000 may be implemented in the form of any system including a processor and a memory that is capable of performing the functions described within this disclosure.

In some embodiments, the processor 1002 can execute software or an algorithm to perform the activities as discussed in this specification, in particular activities related to performing digital-to-analog conversion using a multi-path dual-switch DAC as described herein. The processor 1002 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 1002 may be communicatively coupled to the memory element 1004, for example in a direct-memory access (DMA) configuration, so that the processor 1002 may read from or write to the memory elements 1004.

In general, the memory elements 1004 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 1000 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any of the circuits/components shown in FIGS. 1-8, can also include suitable interfaces for receiving, transmitting, and/or otherwise communicating data or information in a network environment so that they can communicate with, e.g., the data processing system 1000 of another one of these elements.

In certain example implementations, mechanisms for performing digital-to-analog conversion using a multi-path dual-switch DAC as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 1004 shown in FIG. 10, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 1002 shown in FIG. 10, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 1004 may include one or more physical memory devices such as, for example, local memory 1008 and one or more bulk storage devices 1010. The local memory may refer to RAM or other non-persistent memory device(s) generally used during actual execution of the program code. A bulk storage device may be implemented as a hard drive or other persistent data storage device. The processing system 1000 may also include one or more cache memories (not shown) that provide temporary storage of at least some program code in order to reduce the number of times program code must be retrieved from the bulk storage device 1010 during execution.

As shown in FIG. 10, the memory elements 1004 may store an application 1018. In various embodiments, the application 1018 may be stored in the local memory 1008, the one or more bulk storage devices 1010, or apart from the local memory and the bulk storage devices. It should be appreciated that the data processing system 1000 may further execute an operating system (not shown in FIG. 10) that can facilitate execution of the application 1018. The application 1018, being implemented in the form of executable program code, can be executed by the data processing system 1000, e.g., by the processor 1002. Responsive to executing the application, the data processing system 1000 may be configured to perform one or more operations or method steps described herein.

Input/output (I/O) devices depicted as an input device 1012 and an output device 1014, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 1014 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 1014. Input and/or output devices 1012, 1014 may be coupled to the data processing system either directly or through intervening I/O controllers.

In an embodiment, the input and the output devices may be implemented as a combined input/output device (illustrated in FIG. 10 with a dashed line surrounding the input device 1012 and the output device 1014). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 1016 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1000, and a data transmitter for transmitting data from the data processing system 1000 to said systems, devices and/or networks. Modems, cable modems, and Ethernet cards are examples of different types of network adapter that may be used with the data processing system 1000.

Select Examples

The following paragraphs provide examples of various ones of the embodiments disclosed herein.

Example 1 provides a switch driver for generating first and second drive signals for driving, respectively, first and second transistors of a current steering DAC unit. The switch driver includes first, second, third, and fourth paths configured to generate, respectively, first, second, third, and fourth output signals based on a driving code provided to the DAC unit; a first logic gate configured to generate the first drive signal (i.e., the signal used to drive the first transistor of the dual-switch of the DAC stack unit of the current steering DAC unit) based on the first output signal and the second output signal; and a second logic gate configured to generate the second drive signal (i.e., the signal used to drive the first transistor of the dual-switch of the DAC stack unit of the current steering DAC unit) based on the third output signal and the fourth output signal. The first, the second, the third, and the fourth output signals are either all return-to-zero (RTZ) signals or all return-to-one (RTO) signals, the first output signal includes a sequence of odd bits of the driving code, the second output signal includes a sequence of even bits of the driving code, the third output signal includes a sequence of inverted odd bits of the driving code, and the fourth output signal includes a sequence of inverted even bits of the driving code.

Example 2 provides the switch driver according to example 1, where the first, the second, the third, and the fourth output signals are the RTZ signals, and each of the first logic gate and the second logic gate is an OR gate.

Example 3 provides the switch driver according to example 1, where the first, the second, the third, and the fourth output signals are the RTZ signals, and each of the first logic gate and the second logic gate is an NOR gate.

Example 4 provides the switch driver according to example 1, where the first, the second, the third, and the fourth output signals are the RTO signals, and each of the first logic gate and the second logic gate is an AND gate.

Example 5 provides the switch driver according to example 1, where the first, the second, the third, and the fourth output signals are the RTO signals, and each of the first logic gate and the second logic gate is an NAND gate.

Example 6 provides the switch driver according to any one of the preceding examples, further including a third logic gate configured to generate a first dummy drive signal (i.e., a signal used to drive the first dummy transistor of the current steering DAC unit) based on the first output signal and the fourth output signal.

Example 7 provides the switch driver according to example 6, further including control logic configured to use the first drive signal to drive the first transistor to operate in either a first state or a second state and use the first dummy drive signal to drive a first dummy transistor to operate in either the first state or the second state so that, at each clock cycle, exactly one of the first transistor and the first dummy transistor switches from operating in the first state to operating in the second state or switches from operating in the second state to operating in the first state.

Example 8 provides the switch driver according to examples 6 or 7, where odd bits of the first dummy drive signal are same as odd bits of the first drive signal, and even bits of the first dummy drive signal are inverted even bits of the first drive signal.

Example 9 provides the switch driver according to any one of examples 6-8, further including a fourth logic gate configured to generate a second dummy drive signal (i.e., a signal used to drive the second dummy transistor of the current steering DAC unit) based on the second output signal and the third output signal.

Example 10 provides the switch driver according to example 9, further including control logic configured to use the second drive signal to drive the second transistor to operate in either the first state or the second state and use the second dummy drive signal to drive a second dummy transistor to operate in either the first state or the second state so that, at each clock cycle, exactly one of the second transistor and the second dummy transistor switches from operating in the first state to operating in the second state or switches from operating in the second state to operating in the first state.

Example 11 provides the switch driver according to examples 9 or 10, where odd bits of the second dummy drive signal are same as odd bits of the second drive signal, and even bits of the second dummy drive signal are inverted even bits of the second drive signal.

Example 12 provides the switch driver according to any one of examples 1-11, where the driving code is a single data rate (SDR) driving code.

Example 13 provides the switch driver according to any one of examples 1-11, where the driving code is a double data rate (DDR) driving code.

Example 14 provides the switch driver according to any one of examples 1-11, where the driving code is a mixed mode driving code.

Example 15 provides the switch driver according to any one of the preceding examples, where each of the first, the second, the third, and the fourth paths includes one or more latch circuits.

Example 16 provides the switch driver according to any one of the preceding examples, where one or more components of each of the first, the second, the third, and the fourth paths (e.g., any of the one or more latch circuits) operate at half of a clock rate of the first drive signal Example 17 provides a current steering DAC unit that includes a DAC stack and a switch driver. The DAC stack includes a current source (e.g., the current source 304 of FIG. 3), configured to generate a current, and a dual-switch arrangement including first and second transistors driven by first and second drive signals respectively, configured to steer the current to a first output or a second output of the DAC stack depending on a driving code to the current steering DAC unit. The switch driver is configured to receive the driving code (e.g., the code ABCD), the driving code including a sequence of single-bit values (e.g., each of A, B, C, and D is a single-bit value of the driving code), and to generate the first and the second drive signals based on the driving code. The switch driver includes a first path configured to generate a first output signal based on a first input signal, where each of the first output signal and the first input signal includes a sequence of odd bits of the driving code in a return-to-zero or a return-to-one arrangement, a second path configured to generate a second output signal based on a second input signal, where each of the second output signal and the second input signal includes a sequence of even bits of the driving code in the return-to-zero or the return-to-one arrangement, a third path configured to generate a third output signal based on a third input signal, where each of the third output signal and the third input signal includes a sequence of inverted odd bits of the driving code in a return-to-zero or a return-to-one arrangement, and a fourth path configured to generate a fourth output signal based on a fourth input signal, where each of the fourth output signal and the fourth input signal includes a sequence of inverted even bits of the driving code in the return-to-zero or the return-to-one arrangement. The switch driver also includes a first logic gate configured to generate the first drive signal (i.e., the signal used to drive the first transistor of the dual-switch of the DAC stack unit) by combining the first output signal and the second output signal, and a second logic gate configured to generate the second drive signal (i.e., the signal used to drive the first transistor of the dual-switch of the DAC stack unit) by combining the third output signal and the fourth output signal.

Example 18 provides the DAC unit according to example 17, where the DAC unit is included in a DAC system that includes a plurality of DAC units such as the DAC unit.

Example 19 provides a method of generating first and second drive signals for driving, respectively, first and second transistors of a current steering DAC unit. The method includes providing first, second, third, and fourth input signals to, respectively, first, second, third, and fourth paths to generate, respectively, first, second, third, and fourth output signals; providing the first output signal and the second output signal as, respectively, first and second inputs to a first logic gate to generate the first drive signal as an output of the first logic gate; and providing the third output signal and the fourth output signal as, respectively, first and second inputs to a second logic gate to generate the second drive signal as an output of the second logic gate. The first, the second, the third, and the fourth output signals are either all return-to-zero (RTZ) signals or all return-to-one (RTO) signals, the first output signal includes odd bits of a driving code provided to the DAC unit, the second output signal includes even bits of the driving code, the third output signal includes inverted odd bits of the driving code, and the fourth output signal includes inverted even bits of the driving code.

Example 20 provides the method according to example 19, further including providing the first output signal and the fourth output signal as, respectively, first and second inputs to a third logic gate to generate a first dummy drive signal as an output of the third logic gate; providing the third output signal and the second output signal as, respectively, first and second inputs to a fourth logic gate to generate a second dummy drive signal as an output of the fourth logic gate; using the first drive signal to drive the first transistor to operate in either a first state or a second state and using the first dummy drive signal to drive a first dummy transistor to operate in either the first state or the second state so that, at each clock cycle, exactly one of the first transistor and the first dummy transistor switches from operating in the first state to operating in the second state or switches from operating in the second state to operating in the first state; and using the second drive signal to drive the second transistor to operate in either the first state or the second state and using the second dummy drive signal to drive a second dummy transistor to operate in either the first state or the second state so that, at each clock cycle, exactly one of the second transistor and the second dummy transistor switches from operating in the first state to operating in the second state or switches from operating in the second state to operating in the first state.

VARIATIONS AND IMPLEMENTATIONS

While embodiments of the present disclosure were described above with references to example implementations as shown in figures, a person skilled in the art will realize that the various teachings described above are applicable to a large variety of other implementations. For example, while some descriptions provided in the present disclosure refer to thermometer or binary coding, these descriptions are equally applicable to other coding methods used in DACs.

In various embodiments, performing digital-to-analog conversion using a multi-path dual-switch DAC as described herein may be implemented in different DAC architectures, with different DAC segmentation schemes, or in DACs that are not segmented.

In certain contexts, the features discussed herein can be applicable to automotive systems, safety-critical industrial applications, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of performing digital-to-analog conversion using a multi-path dual-switch DAC discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, such as e.g. clocks, multiplexers, buffers, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to performing digital-to-analog conversion using a multi-path dual-switch DAC.

Parts of various systems for performing digital-to-analog conversion using a multi-path dual-switch DAC as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure related to performing digital-to-analog conversion using a multi-path dual-switch DAC described herein may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of performing digital-to-analog conversion using a multi-path dual-switch DAC proposed herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present figures may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the present figures and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to performing digital-to-analog conversion using a multi-path dual-switch DAC as proposed herein illustrate only some of the possible functions that may be executed by, or within, systems illustrated in figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the apparatus described above may also be implemented with respect to the method or process described herein and specifics in the examples may be used anywhere in one or more embodiments.

The invention claimed is:

1. A switch driver for generating first and second drive signals for driving, respectively, first and second transistors of a current steering digital-to-analog converter (DAC) unit, the switch driver comprising:
    first, second, third, and fourth paths configured to generate, respectively, first, second, third, and fourth output signals based on a driving code provided to the DAC unit;
    a first logic gate configured to generate the first drive signal based on the first output signal and the second output signal; and
    a second logic gate configured to generate the second drive signal based on the third output signal and the fourth output signal,
    wherein:
        the first, the second, the third, and the fourth output signals are either all return-to-zero (RTZ) signals or all return-to-one (RTO) signals,
        the first output signal includes a sequence of odd bits of the driving code,
        the second output signal includes a sequence of even bits of the driving code,
        the third output signal includes a sequence of inverted odd bits of the driving code, and
        the fourth output signal includes a sequence of inverted even bits of the driving code.

2. The switch driver according to claim 1, wherein:
    the first, the second, the third, and the fourth output signals are the RTZ signals, and
    each of the first logic gate and the second logic gate is an OR gate.

3. The switch driver according to claim 1, wherein:
    the first, the second, the third, and the fourth output signals are the RTZ signals, and
    each of the first logic gate and the second logic gate is an NOR gate.

4. The switch driver according to claim 1, wherein:
    the first, the second, the third, and the fourth output signals are the RTO signals, and
    each of the first logic gate and the second logic gate is an AND gate.

5. The switch driver according to claim 1, wherein:
    the first, the second, the third, and the fourth output signals are the RTO signals, and
    each of the first logic gate and the second logic gate is an NAND gate.

6. The switch driver according to claim 1, further comprising:
    a third logic gate configured to generate a first dummy drive signal based on the first output signal and the fourth output signal.

7. The switch driver according to claim 6, further configured to:
    use the first drive signal to drive the first transistor to operate in either a first state or a second state and use the first dummy drive signal to drive a first dummy transistor to operate in either the first state or the second state so that, at each clock cycle, exactly one of the first transistor and the first dummy transistor switches from operating in the first state to operating in the second state or switches from operating in the second state to operating in the first state.

8. The switch driver according to claim 6, wherein:
    odd bits of the first dummy drive signal are same as odd bits of the first drive signal, and even bits of the first dummy drive signal are inverted even bits of the first drive signal.

9. The switch driver according to claim 6, further comprising:
    a fourth logic gate configured to generate a second dummy drive signal based on the second output signal and the third output signal.

10. The switch driver according to claim 9, further configured to:

use the second drive signal to drive the second transistor to operate in either the first state or the second state and use the second dummy drive signal to drive a second dummy transistor to operate in either the first state or the second state so that, at each clock cycle, exactly one of the second transistor and the second dummy transistor switches from operating in the first state to operating in the second state or switches from operating in the second state to operating in the first state.

11. The switch driver according to claim 9, wherein:
odd bits of the second dummy drive signal are same as odd bits of the second drive signal, and even bits of the second dummy drive signal are inverted even bits of the second drive signal.

12. The switch driver according to claim 1, wherein the driving code is a single data rate (SDR) driving code.

13. The switch driver according to claim 1, wherein the driving code is a double data rate (DDR) driving code.

14. The switch driver according to claim 1, wherein the driving code is a mixed mode driving code.

15. The switch driver according to claim 1, wherein each of the first, the second, the third, and the fourth paths includes one or more latch circuits.

16. The switch driver according to claim 1, wherein one or more components of each of the first, the second, the third, and the fourth paths operate at half of a clock rate of the first drive signal.

17. A current steering digital-to-analog converter (DAC) unit, comprising:
a DAC stack, comprising:
a current source, configured to generate a current,
a dual-switch arrangement comprising first and second transistors driven by first and second drive signals respectively, configured to steer the current to a first output or a second output of the DAC stack depending on a driving code to the current steering DAC unit; and
a switch driver configured to receive the driving code, the driving code comprising a sequence of single-bit values, and to generate the first and the second drive signals based on the driving code, the switch driver comprising:
a first path configured to generate a first output signal based on a first input signal, where each of the first output signal and the first input signal includes a sequence of odd bits of the driving code in a return-to-zero or a return-to-one arrangement,
a second path configured to generate a second output signal based on a second input signal, where each of the second output signal and the second input signal includes a sequence of even bits of the driving code in the return-to-zero or the return-to-one arrangement,
a third path configured to generate a third output signal based on a third input signal, where each of the third output signal and the third input signal includes a sequence of inverted odd bits of the driving code in a return-to-zero or a return-to-one arrangement,
a fourth path configured to generate a fourth output signal based on a fourth input signal, where each of the fourth output signal and the fourth input signal includes a sequence of inverted even bits of the driving code in the return-to-zero or the return-to-one arrangement,
a first logic gate configured to generate the first drive signal by combining the first output signal and the second output signal, and
a second logic gate configured to generate the second drive signal by combining the third output signal and the fourth output signal.

18. The DAC unit according to claim 17, wherein the DAC unit is included in a DAC system that includes a plurality of DAC units such as the DAC unit.

19. A method of generating first and second drive signals for driving, respectively, first and second transistors of a current steering digital-to-analog converter (DAC) unit, the method comprising:
providing first, second, third, and fourth input signals to, respectively, first, second, third, and fourth paths to generate, respectively, first, second, third, and fourth output signals;
providing the first output signal and the second output signal as, respectively, first and second inputs to a first logic gate to generate the first drive signal as an output of the first logic gate; and
providing the third output signal and the fourth output signal as, respectively, first and second inputs to a second logic gate to generate the second drive signal as an output of the second logic gate,
wherein:
the first, the second, the third, and the fourth output signals are either all return-to-zero (RTZ) signals or all return-to-one (RTO) signals,
the first output signal includes odd bits of a driving code provided to the DAC unit,
the second output signal includes even bits of the driving code,
the third output signal includes inverted odd bits of the driving code, and
the fourth output signal includes inverted even bits of the driving code.

20. The method according to claim 19, further comprising:
providing the first output signal and the fourth output signal as, respectively, first and second inputs to a third logic gate to generate a first dummy drive signal as an output of the third logic gate; and
providing the third output signal and the second output signal as, respectively, first and second inputs to a fourth logic gate to generate a second dummy drive signal as an output of the fourth logic gate;
using the first drive signal to drive the first transistor to operate in either a first state or a second state and using the first dummy drive signal to drive a first dummy transistor to operate in either the first state or the second state so that, at each clock cycle, exactly one of the first transistor and the first dummy transistor switches from operating in the first state to operating in the second state or switches from operating in the second state to operating in the first state; and
using the second drive signal to drive the second transistor to operate in either the first state or the second state and using the second dummy drive signal to drive a second dummy transistor to operate in either the first state or the second state so that, at each clock cycle, exactly one of the second transistor and the second dummy transistor switches from operating in the first state to operating in the second state or switches from operating in the second state to operating in the first state.

* * * * *